United States Patent
Sakui et al.

(10) Patent No.: US 12,367,922 B2
(45) Date of Patent: Jul. 22, 2025

(54) SEMICONDUCTOR ELEMENT MEMORY DEVICE

(71) Applicant: Unisantis Electronics Singapore Pte. Ltd., Singapore (SG)

(72) Inventors: Koji Sakui, Tokyo (JP); Nozomu Harada, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 209 days.

(21) Appl. No.: 18/225,572

(22) Filed: Jul. 24, 2023

(65) Prior Publication Data

US 2023/0377634 A1   Nov. 23, 2023

Related U.S. Application Data

(63) Continuation-in-part of application No. PCT/JP2021/002368, filed on Jan. 25, 2021.

(51) Int. Cl.
*G11C 11/4076*   (2006.01)
*G11C 11/4093*   (2006.01)
(Continued)

(52) U.S. Cl.
CPC ...... *G11C 11/4096* (2013.01); *G11C 11/4076* (2013.01); *G11C 11/4093* (2013.01); *G11C 16/04* (2013.01); *G11C 2211/4016* (2013.01)

(58) Field of Classification Search
CPC ............ G11C 11/4096; G11C 11/4076; G11C 11/4093
(Continued)

(56) References Cited

U.S. PATENT DOCUMENTS

2003/0111681 A1   6/2003   Kawanaka
2006/0049444 A1   3/2006   Shino
(Continued)

FOREIGN PATENT DOCUMENTS

JP   H 02-188966 A   7/1990
JP   H 03-171768 A   7/1991
(Continued)

OTHER PUBLICATIONS

Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, vol. 38, No. 3, pp. 573-578 (1991).
(Continued)

*Primary Examiner* — Ly D Pham
(74) *Attorney, Agent, or Firm* — Crowell & Moring LLP

(57) ABSTRACT

There is provided a columnar semiconductor memory device in which a data retention operation is performed in which voltages applied to a first gate conductor layer, a second gate conductor layer, a first impurity region, and a second impurity region are controlled to retain a group of positive holes, generated by an impact ionization phenomenon or a gate-induced drain leakage current, inside a semiconductor body, and a data erase operation is performed in which the voltages applied to the first gate conductor layer, the second gate conductor layer, the first impurity region, and the second impurity region are controlled to discharge the group of positive holes from inside the semiconductor body and the voltage of the semiconductor body is lowered with capacitive coupling with the first gate conductor layer and capacitive coupling with the second gate conductor layer.

9 Claims, 14 Drawing Sheets

(51) Int. Cl.
*G11C 11/4096* (2006.01)
*G11C 16/04* (2006.01)

(58) Field of Classification Search
USPC .................................................. 365/189.011
See application file for complete search history.

(56) References Cited

U.S. PATENT DOCUMENTS

| | | | |
|---|---|---|---|
| 2008/0137394 | A1 | 6/2008 | Shimano |
| 2008/0212366 | A1 | 9/2008 | Ohsawa |
| 2022/0336463 | A1* | 10/2022 | Sakui ................ H10B 12/036 |
| 2022/0406780 | A1* | 12/2022 | Sakui ................ G11C 11/4091 |
| 2022/0406781 | A1* | 12/2022 | Sakui ................ G11C 11/406 |

FOREIGN PATENT DOCUMENTS

| | | |
|---|---|---|
| JP | 2006-080280 A | 3/2006 |
| JP | 3957774 B2 | 8/2007 |
| JP | 2008-218556 A | 9/2008 |

OTHER PUBLICATIONS

H. Chung, H. Kim, H. Kim, K. Kim, S. Kim, K. Dong, J. Kim, Y. C. Oh, Y. Hwang, H. Hong, G. Jin, and C. Chung: "Novel 4F2 DRAM Cell with Vertical Pillar Transistor (VPT)," 2011 Proceeding of the European Solid-State Device Research Conference, (2011).

H. S. Philip Wong, S. Raoux, S. Kim, Jiale Liang, J. R. Reifenberg, B. Rajendran, M. Asheghi and K. E. Goodson: "Phase Change Memory," Proceeding of IEEE, vol. 98, No. 12, Dec., pp. 2201-2227 (2010).

T. Tsunoda, K. Kinoshita, H. Noshiro, Y. Yamazaki, T. Iizuka, Y. Ito, A. Takahashi, A. Okano, Y. Sato, T. Fukano, M. Aoki, and Y. Sugiyama: "Low Power and high Speed Switching of Ti-doped NiO ReRAM under the Unipolar Voltage Source of less than 3V," IEDM (2007).

W. Kang, L. Zhang, J. Klein, Y. Zhang, D. Ravelosona, and W. Zhao: "Reconfigurable Codesign of STT-MRAM Under Process Variations in Deeply Scaled Technology," IEEE Transaction on Electron Devices, pp. 1-9 (2015).

M.G. Ertosum, K. Lim, C. Park, J. Oh, P. Kirsch, and K. C. Saraswat: "Novel Capacitorless Single-Transistor Charge-Trap DRAM (1T CT DRAM) Utilizing Electron," IEEE Electron Device Letter, vol. 31, No. 5, pp. 405-407 (2010).

J. Wan, L. Rojer, A. Zaslavsky, and S. Critoloveanu: "A Compact Capacitor-Less High-Speed DRAM Using Field Effect-Controlled Charge Regeneration," Electron Device Letters, vol. 35, No. 2, pp. 179-181 (2012).

T. Ohsawa, K. Fujita, T. Higashi, Y. Iwata, T. Kajiyama, Y. Asao, and K. Sunouchi: "Memory design using a one-transistor gain cell on SOI," IEEE JSSC, vol. 37, No. 11, pp. 1510-1522 (2002).

T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32nm Node and Beyond," IEEE IEDM (2006).

E. Yoshida and T. Tanaka: "A Design of a Capacitorless 1T-DRAM Cell Using Gate-induced Drain Leakage (GIDL) Current for Low-power and High-speed Embedded Memory," IEEE IEDM, pp. 913-916, Dec. 2003.

J. Y. Song, W. Y. Choi, J. H. Park, J. D. Lee, and B-G. Park: "Design Optimization of Gate-All-Around (GAA) MOSFETs," IEEE Trans. Electron Devices, vol. 5, No. 3, pp. 186-191, May 2006.

N. Loubet, et al.: "Stacked Nanosheet Gate-All-Around Transistor to Enable Scaling Beyond FinFET," 2017 IEEE Symposium on VLSI Technology Digest Technical Papers, T17-5, T230-T231, Jun. 2017.

H. Jiang, N. Xu, B. Chen, L. Zeng1, Y. He, G. Du, X. Liu and X. Zhang: "Experimental investigation of self heating effect (SHE) in multiple-fin SOI FinFETS," Semicond. Sci. Technol. 29 (2014) 115021 (7 pp).

E. Yoshida, and T. Tanaka: "A Capacitorless 1T-DRAM Technology Using Gate-Induced Drain-Leakage (GIDL) Current for Low-Power and High-Speed Embedded Memory," IEEE Transactions on Electron Devices, vol. 53, No. 4, pp. 692-697, Apr. 2006.

F. Morishita, H. Noda, I. Hayashi, T. Gyohten, M. Oksmoto, T. Ipposhi, S. Maegawa, K. Dosaka, and K. Arimoto: "A Capacitorless Twin-Transistor Random Access Memory (TTRAM) on SOI," IEICE Trans. Electron., vol. E90-c., No. 4 pp. 765-771 (2007).

International Search Report (PCT/ISA/210) (Japanese) from PCT/JP2021/002368 dated Mar. 9, 2021, 3 pgs. *See* a translation identified as A26.

English translation of International Search of Search Report (PCT/ISA/210) of PCT/JP2021/002368, 2 pgs.

Written Opinion (PCT/ISA/237) (Japanese) of PCT/JP2021/002368 dated Mar. 9, 2021, 3 pgs.

F. Morishita, H. Noda, I. Hayashi, T. Gyohten, M. Okamoto, T. Ipposhi, S. Maegawa, K. Dosaka, and K. Arimoto: "A Capacitorless Twin-Transistor Random Access Memory (TTRAM) on SOI," IEICE Trans. Electron., vol. E90-c., No. 4 pp. 765-771 (2007) *a brief description attached*.

* cited by examiner

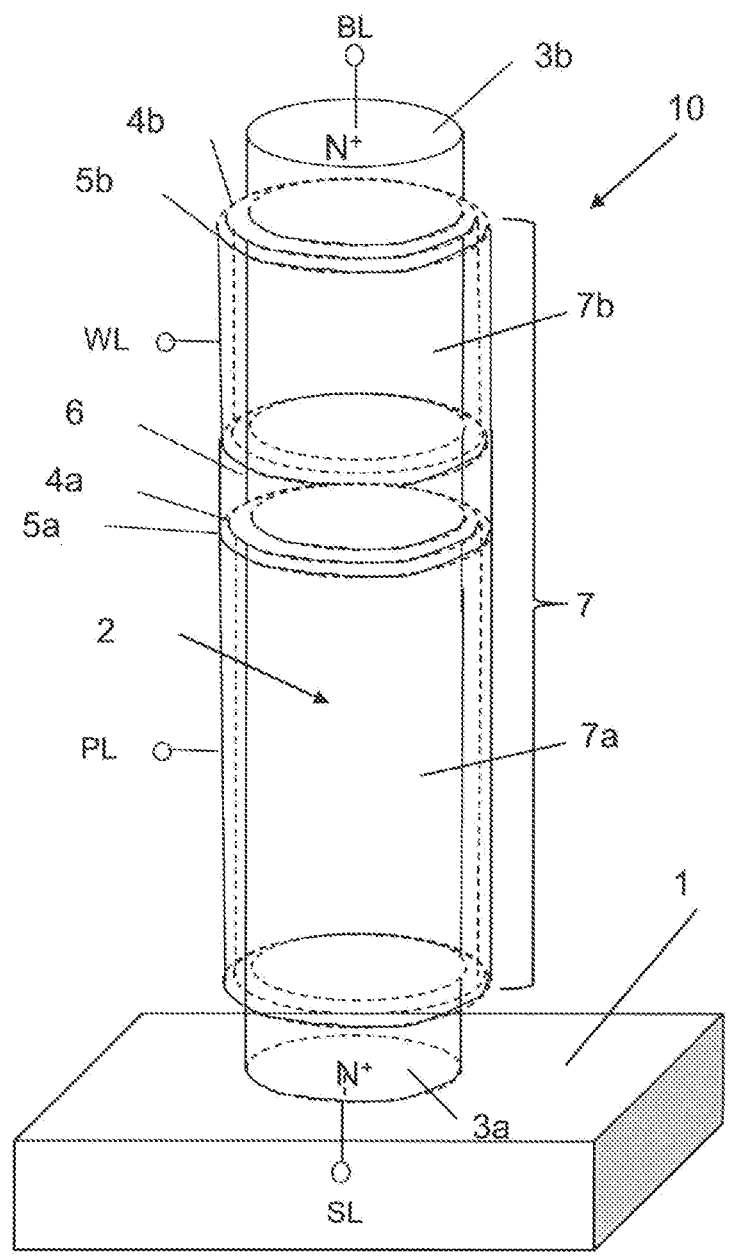

FIG. 2A

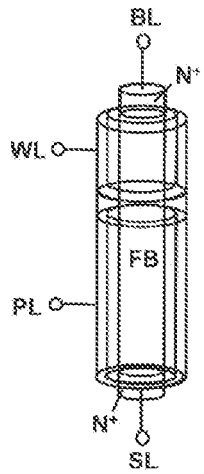

FIG. 2B

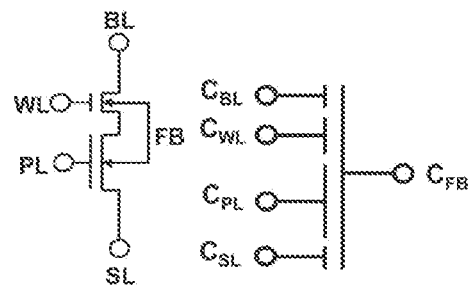

$$C_{FB} = C_{WL} + C_{PL} + C_{BL} + C_{SL} \quad (1)$$

$$\beta_{WL} \approx \frac{C_{WL}}{C_{WL} + C_{PL} + C_{BL} + C_{SL}} \quad (2) \Rightarrow \text{SMALL } \beta_{WL}$$

$$\beta_{PL} \approx \frac{C_{PL}}{C_{WL} + C_{PL} + C_{BL} + C_{SL}} \quad (3) \Rightarrow \text{LARGE } \beta_{PL}$$

$$\beta_{BL} \approx \frac{C_{BL}}{C_{WL} + C_{PL} + C_{BL} + C_{SL}} \quad (4) \Rightarrow \text{SMALL } \beta_{BL}$$

$$\beta_{SL} \approx \frac{C_{SL}}{C_{WL} + C_{PL} + C_{BL} + C_{SL}} \quad (5) \Rightarrow \text{SMALL } \beta_{SL}$$

FIG. 2C

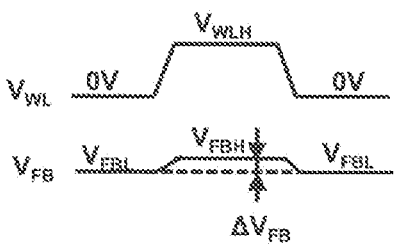

$$\Delta V_{FB} = V_{FBH} - V_{FBL}$$

$$= \underline{\underline{\beta_{WL} \times V_{WLH}}} \quad (6)$$
$$\text{SMALL}$$

SUBSTANTIAL DRAIN $$V_{FB}"1" = Vb - \beta_{WL} \times Vt_{WL}"1" - \beta_{BL} \times V_{BLH} \quad (7)$$

SMALL

FIG. 4AA

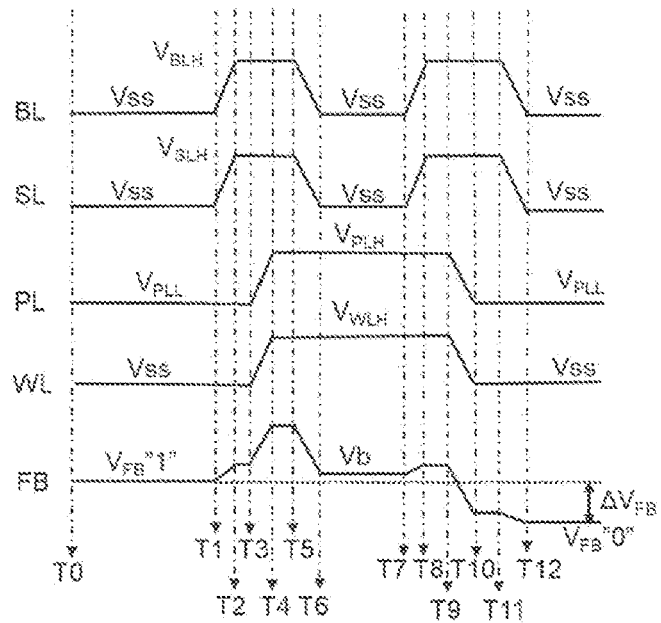

T3 TO T4: FIRST PERIOD
T5 TO 56: SECOND PERIOD
T9 TO T10: THIRD PERIOD

FIG. 4AB

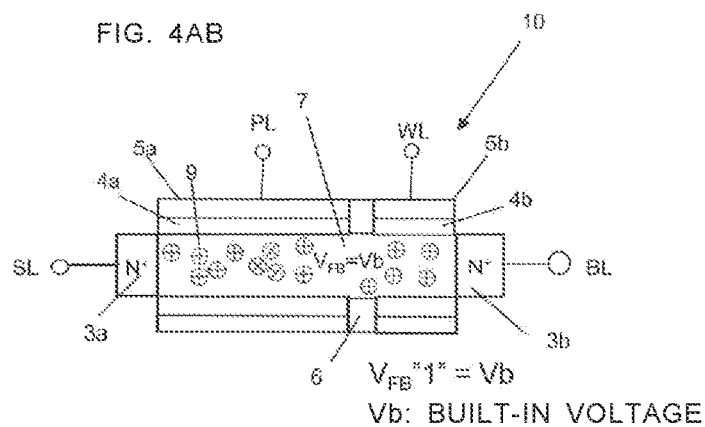

Vb: BUILT-IN VOLTAGE $$V_{FB}\text{"1"} = Vb - \beta_{WL} \times Vt_{WL}\text{"1"} - \beta_{BL} \times V_{BLH} \quad (7)$$

$$V_{FB}\text{"0"} = Vb - \beta_{WL} \times V_{WLH} - \beta_{PL} \times (V_{PLH} - V_{PLL}) \quad (8)$$

$$\begin{aligned}\Delta V_{FB} &= V_{FB}\text{"1"} - V_{FB}\text{"0"} \\ &= \beta_{WL} \times V_{WLH} + \beta_{PL} \times (V_{PLH} - V_{PLL}) \\ &\quad - \beta_{WL} \times Vt_{WL}\text{"1"} - \beta_{BL} \times V_{BLH} \quad (9)\end{aligned}$$

FIG. 4AC

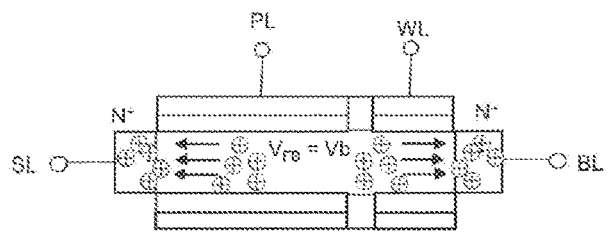

Vb: BUILT-IN VOLTAGE 0.7V

FIG. 6B

| SELECTED/NON-SELECTED | SIGNAL LINE | APPLIED VOLTAGE |
|---|---|---|
| "0" ERASED BLOCK | BIT LINE BL | $V_{SS} \Rightarrow V_{BLH}$ (e.g.: 3V) $\Rightarrow V_{SS} \Rightarrow V_{BLH} \Rightarrow V_{SS}$ |
| | SOURCE LINE SL | $V_{SS} \Rightarrow V_{SLH}$ (e.g.: 3V) $\Rightarrow V_{SS} \Rightarrow V_{SLH} \Rightarrow V_{SS}$ |
| | PLATE LINE PL | $V_{PLL}$ (e.g.: 2V) $\Rightarrow V_{PLH}$ (e.g.: 4V) $\Rightarrow V_{PLL}$ |
| | WORD LINE WL | $V_{SS}$ (e.g.: 0V) $\Rightarrow V_{WLH}$ (e.g.: 4V) $\Rightarrow V_{SS}$ |
| | FLOATING BODY FB | $V_b \Rightarrow V_b - \beta_{WL} \times V_{WLH} - \beta_{PL} \times (V_{PLH} - V_{PLL})$ |
| NON-ERASED BLOCK (RECORDED-DATA RETAINING BLOCK) | BIT LINE BL | $V_{SS}$ (e.g.: 0V) |
| | SOURCE LINE SL | $V_{SS}$ (e.g.: 0V) |
| | PLATE LINE PL | $V_{PLL}$ (e.g.: 2V) |
| | WORD LINE WL | $V_{SS}$ (e.g.: 0V) |
| | FLOATING BODY FB | $V_b$ OR $V_b - \beta_{WL} \times V_{WLH} - \beta_{PL} \times (V_{PLH} - V_{PLL})$ |

Vb: BUILT-IN VOLTAGE 0.7V

FIG. 7A

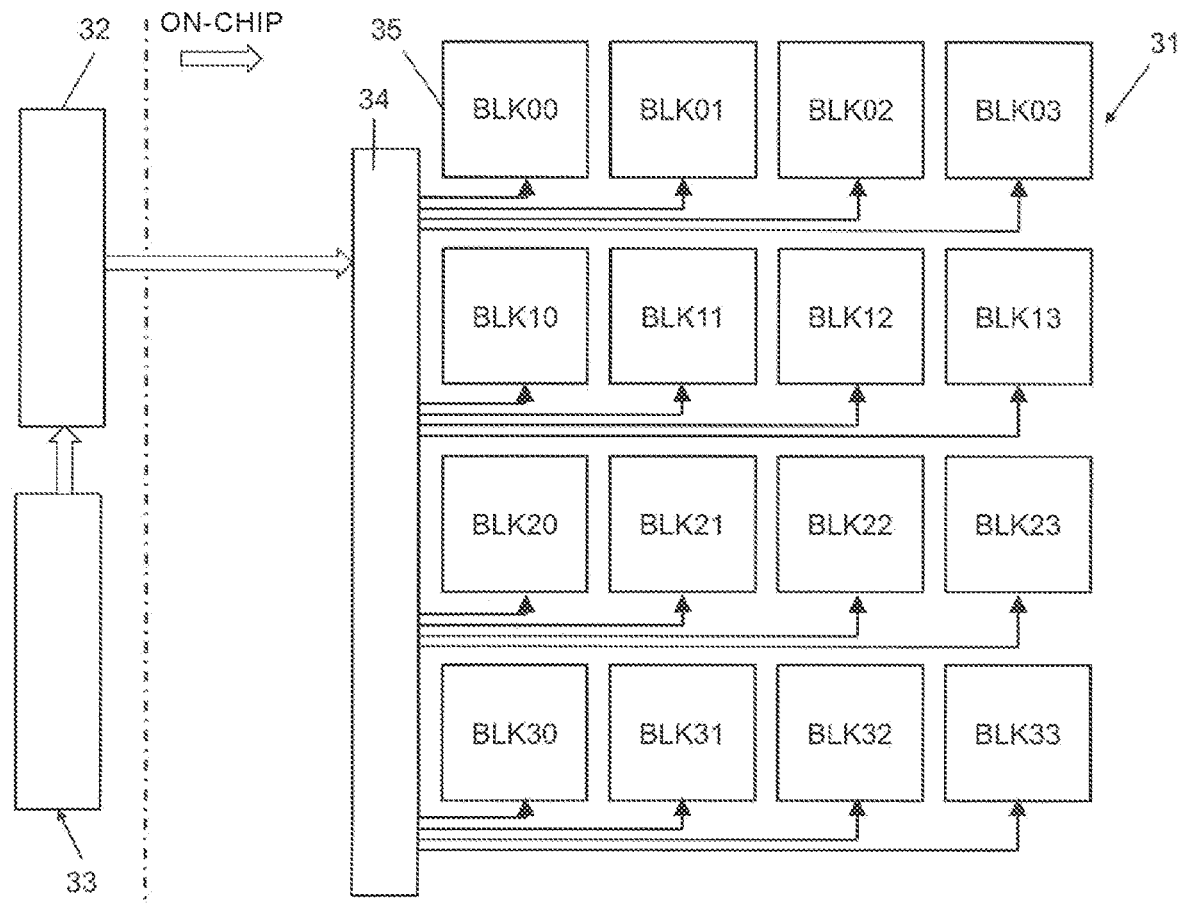

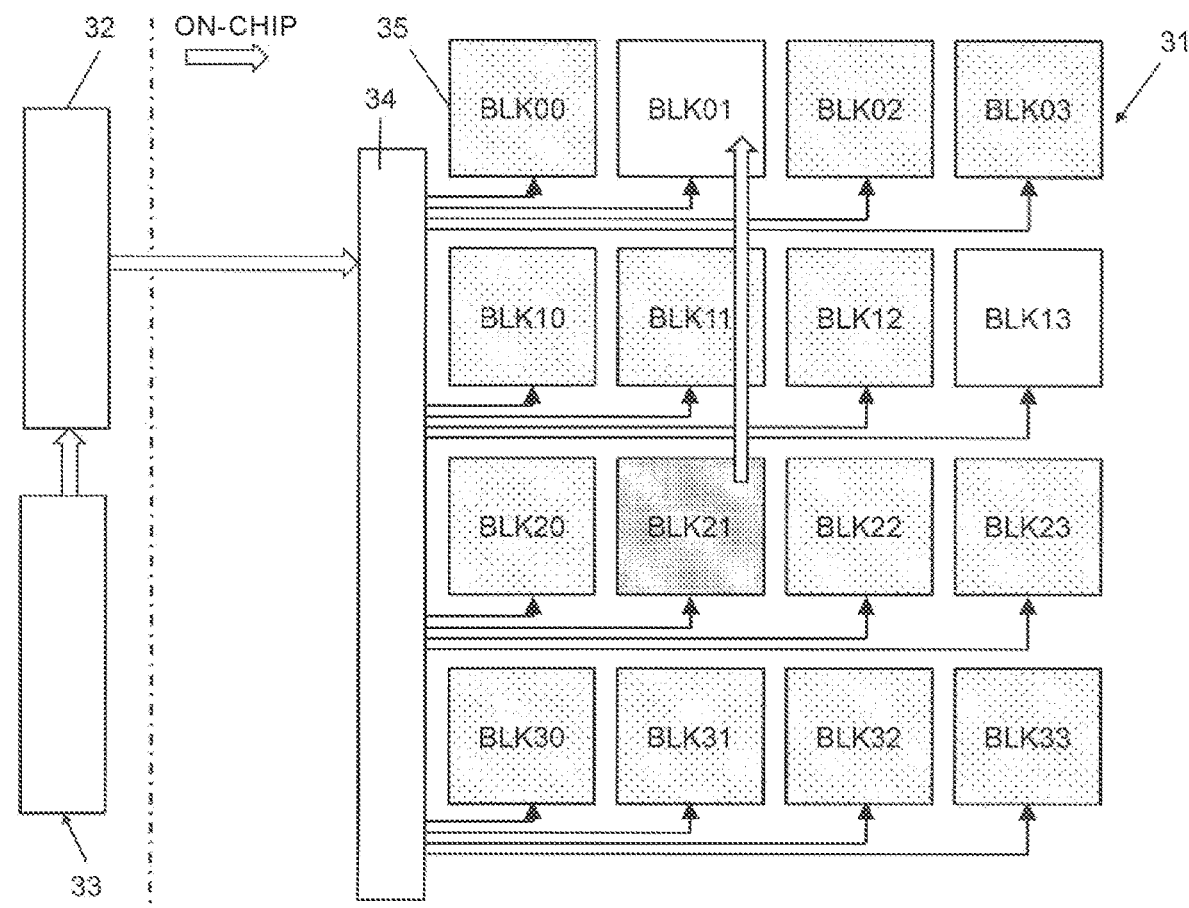

$$C_{FB} = C_{WL} + C_{BL} + C_{SL} \quad (10)$$

$$\beta_{WL} = \frac{C_{WL}}{C_{WL} + C_{BL} + C_{SL}} \quad (11)$$

$$\Delta V_{FB} = V_{FB2} - V_{FB1}$$
$$= \beta_{WL} \times V_{WLH} \quad (12)$$

SEMICONDUCTOR ELEMENT MEMORY DEVICE

CROSS REFERENCES TO RELATED APPLICATIONS

The present application is a continuation-in-part application of PCT/JP2021/002368, filed Jan. 25, 2021, the entire contents of which are incorporated herein by reference.

BACKGROUND OF THE INVENTION

1. Field of the Invention

The present invention relates to a semiconductor-element-including semiconductor memory device.

2. Description of the Related Art

Recently, there has been a demand for highly integrated and high-performance memory elements in the development of LSI (Large Scale Integration) technology.

Typical planar MOS transistors include a channel that extends in a horizontal direction along the upper surface of the semiconductor substrate. In contrast, SGTs include a channel that extends in a direction perpendicular to the upper surface of the semiconductor substrate (see, for example, Japanese Unexamined Patent Application Publication No. 2-188966 and Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol. 38, No. 3, pp. 573-578 (1991)). Accordingly, the density of semiconductor devices can be made higher with SGTs than with planar MOS transistors. Such SGTs can be used as selection transistors to implement highly integrated memories, such as a DRAM (Dynamic Random Access Memory, see, for example, H. Chung, H. Kim, H. Kim, K. Kim, S. Kim, K. W. Song, J. Kim, Y. C. Oh, Y. Hwang, H. Hong, G. Jin, and C. Chung: "4F2 DRAM Cell with Vertical Pillar Transistor (VPT)", 2011 Proceeding of the European Solid-State Device Research Conference, (2011)) to which a capacitor is connected, a PCM (Phase Change Memory, see, for example, H. S. Philip Wong, S. Raoux, S. Kim, Jiale Liang, J. R. Reifenberg, B. Rajendran, M. Asheghi and K. E. Goodson: "Phase Change Memory", Proceeding of IEEE, Vol. 98, No. 12, December, pp. 2201-2227 (2010)) to which a resistance change element is connected, an RRAM (Resistive Random Access Memory, see, for example, K. Tsunoda, K. Kinoshita, H. Noshiro, Y. Yamazaki, T. Iizuka, Y. Ito, A. Takahashi, A. Okano, Y. Sato, T. Fukano, M. Aoki, and Y. Sugiyama: "Low Power and High Speed Switching of Ti-doped NiO ReRAM under the Unipolar Voltage Source of less than 3V", IEDM (2007)), and an MRAM (Magneto-resistive Random Access Memory, see, for example, W. Kang, L. Zhang, J. Klein, Y. Zhang, D. Ravelosona, and W. Zhao: "Reconfigurable Codesign of STT-MRAM Under Process Variations in Deeply Scaled Technology", IEEE Transaction on Electron Devices, pp. 1-9 (2015)) that changes the resistance by changing the orientation of a magnetic spin with a current. Further, there exists, for example, a DRAM memory cell (see Japanese Unexamined Patent Application Publication No. 3-171768 and M. G. Ertosun, K. Lim, C. Park, J. Oh, P. Kirsch, and K. C. Saraswat: "Novel Capacitorless Single-Transistor Charge-Trap DRAM (1T CT DRAM) Utilizing Electron", IEEE Electron Device Letter, Vol. 31, No. 5, pp. 405-407 (2010)) constituted by a single MOS transistor and including no capacitor. The present application relates to a dynamic flash memory that can be constituted only by a MOS transistor and that includes no resistance change element or capacitor.

FIGS. 8A, 8B, 8C and 8D illustrate a write operation of a DRAM memory cell constituted by a single MOS transistor and including no capacitor described above, FIGS. 9A and 9B illustrate a problem in the operation, and FIGS. 10A, 10B and 10C illustrate a read operation (see J. Wan, L. Rojer, A. Zaslavsky, and S. Critoloveanu: "A Compact Capacitor-Less High-Speed DRAM Using Field Effect-Controlled Charge Regeneration", Electron Device Letters, Vol. 35, No. 2, pp. 179-181 (2012), T. Ohsawa, K. Fujita, T. Higashi, Y. Iwata, T. Kajiyama, Y. Asao, and K. Sunouchi: "Memory design using a one-transistor gain cell on SOI", IEEE JSSC, vol. 37, No. 11, pp. 1510-1522 (2002), T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32 nm Node and Beyond", IEEE IEDM (2006), and E. Yoshida and T. Tanaka: "A Design of a Capacitorless 1T-DRAM Cell Using Gate-Induced Drain-Leakage (GIDL) Current for Low-Power and High-Speed Embedded Memory", IEEE IEDM (2003)). FIG. 8A illustrates a "1" write state. Here, the memory cell is formed on an SOI substrate 100, is constituted by a source $N^+$ layer 103 to which a source line SL is connected, a drain $N^+$ layer 104 to which a bit line BL is connected, a gate conductor layer 105 to which a word line WL is connected, and a floating body 102 of a MOS transistor 110, and includes no capacitor. The single MOS transistor 110 constitutes the DRAM memory cell. Directly under the floating body 102, a $SiO_2$ layer 101 of the SOI substrate is in contact with the floating body 102. To write "1" to the memory cell constituted by the single MOS transistor 110, the MOS transistor 110 is operated in the saturation region. That is, a channel 107, for electrons, extending from the source $N^+$ layer 103 has a pinch-off point 108 and does not reach the drain $N^+$ layer 104 to which the bit line is connected. When a high voltage is applied to both of the bit line BL connected to the drain $N^+$ layer and the word line WL connected to the gate conductor layer 105, and the MOS transistor 110 is operated at the gate voltage that is about one-half of the drain voltage, the electric field intensity becomes maximum at the pinch-off point 108 that is in the vicinity of the drain $N^+$ layer 104. As a result, accelerated electrons that flow from the source $N^+$ layer 103 toward the drain $N^+$ layer 104 collide with the Si lattice, and with kinetic energy lost at the time of collision, electron-positive hole pairs are generated (impact ionization phenomenon). Most of the generated electrons (not illustrated) reach the drain $N^+$ layer 104. Further, a very small proportion of the electrons that are very hot pass through a gate oxide film 109 and reach the gate conductor layer 105. With positive holes 106 that are simultaneously generated, the floating body 102 is charged. In this case, the generated positive holes contribute to an increase in the majority carriers because the floating body 102 is P-type Si. When the floating body 102 is filled with the generated positive holes 106 and the voltage of the floating body 102 becomes higher than that of the source $N^+$ layer 103 by Vb or more, further generated positive holes are discharged to the source $N^+$ layer 103. Here, Vb is the built-in voltage of the PN junction between the source $N^+$ layer 103 and the P-layer floating body 102 and is equal to about 0.7 V. FIG. 8B illustrates a state in which the floating body 102 is charged to saturation with the generated positive holes 106.

Now, a "0" write operation of the memory cell 110 will be described with reference to FIG. 8C. For the common selected word line WL, the memory cell 110 to which "1" is written and the memory cell 110 to which "0" is written are present at random. FIG. 8C illustrates a state of rewriting from a "1" write state to a "0" write state. To write "0", the voltage of the bit line BL is set to a negative bias, and the PN junction between the drain N⁺ layer 104 and the P-layer floating body 102 is forward biased. As a result, the positive holes 106 in the floating body 102 generated in advance in the previous cycle flow into the drain N⁺ layer 104 that is connected to the bit line BL. When the write operation ends, the two memory cells are in a state in which the memory cell 110 (FIG. 8B) is filled with the generated positive holes 106, and from the memory cell 110 (FIG. 8C), the generated positive holes are discharged. The potential of the floating body 102 of the memory cell 110 filled with the positive holes 106 becomes higher than that of the floating body 102 in which generated positive holes are not present. Therefore, the threshold voltage of the memory cell 110 to which "1" is written becomes lower than the threshold voltage of the memory cell 110 to which "0" is written. This is illustrated in FIG. 8D.

Now, a problem in the operation of the memory cell constituted by the single MOS transistor 110 will be described with reference to FIGS. 9A and 9B. As illustrated in FIG. 9A, the capacitance $C_{FB}$ of the floating body is equal to the sum of the capacitance $C_{WL}$ between the gate to which the word line is connected and the floating body, the junction capacitance $C_{SL}$ of the PN junction between the source N⁺ layer 103 to which the source line is connected and the floating body 102, and the junction capacitance $C_{BL}$ of the PN junction between the drain N⁺ layer 104 to which the bit line is connected and the floating body 102 and is expressed as follows.

$$C_{FB}=C_{WL}+C_{BL}+C_{SL} \quad (10)$$

The capacitive coupling ratio $\beta_{WL}$ between the gate to which the word line is connected and the floating body is expressed as follows.

$$\beta_{WL}=C_{WL}/(C_{WL}+C_{BL}+C_{SL}) \quad (11)$$

Therefore, a change in the word line voltage $V_{WL}$ at the time of reading or writing affects the voltage of the floating body 102 that functions as a storage node (contact point) of the memory cell. This is illustrated in FIG. 9B. When the word line voltage $V_{WL}$ rises from 0 V to $V_{WLH}$ at the time of reading or writing, the voltage $V_{FB}$ of the floating body 102 rises from $V_{FB1}$, which is the voltage in the initial state before the word line voltage changes, to $V_{FB2}$ due to capacitive coupling with the word line. The voltage change amount $\Delta V_{FB}$ is expressed as follows.

$$\Delta V_{FB} = V_{FB2} - V_{FB1} \quad (12)$$
$$= \beta_{WL} \times V_{WLH}$$

Here, for $\beta_{WL}$ in expression (11), the contribution ratio of $C_{WL}$ is large and, for example, $C_{WL}:C_{BL}:C_{SL}=8:1:1$ holds. This results in $\beta_{WL}=0.8$. When the word line changes, for example, from 5 V at the time of writing to 0 V after the end of writing, the floating body 102 receives an amplitude noise of 5 V×$\beta_{WL}$=4 V due to capacitive coupling between the word line WL and the floating body 102. Accordingly, a sufficient margin is not provided to the potential difference between the "1" potential and the "0" potential of the floating body 102 at the time of writing, which has been a problem.

FIGS. 10A, 10B and 10C illustrate a read operation where FIG. 10A illustrates a "1" write state and FIG. 10B illustrates a "0" write state. In actuality, however, even when Vb is set for the floating body 102 to write "1", once the word line returns to 0 V at the end of writing, the floating body 102 is lowered to a negative bias. When "0" is written, the floating body 102 is lowered to a further negative bias, and it is difficult to provide a sufficiently large margin to the potential difference between "1" and "0" at the time of writing as illustrated in FIG. 10C.

Therefore, there has been difficulty in commercially introducing DRAM memory cells actually including no capacitor.

SUMMARY OF THE INVENTION

In capacitor-less single-transistor DRAMs (gain cells), capacitive coupling between the word line and the floating body is strong. When the potential of the word line is changed at the time of data reading or at the time of data writing, the change is directly transmitted to the floating body as noise, which has been a problem. This causes a problem of erroneous reading or erroneous rewriting of storage data, and it has been difficult to commercially introduce capacitor-less single-transistor DRAMs (gain cells).

To address the above-described problems, a semiconductor element memory device according to the present invention includes:

a semiconductor body that stands on a substrate in a vertical direction relative to the substrate or that extends along the substrate in a horizontal direction relative to the substrate;

a first impurity region and a second impurity region that are disposed at respective ends of the semiconductor body;

a gate insulator layer that is in contact with a side surface of the semiconductor body between the first impurity region and the second impurity region;

a first gate conductor layer that partially or entirely covers the gate insulator layer; and a second gate conductor layer that is adjacent to the first gate conductor layer and that is in contact with a side surface of the gate insulator layer, in which voltages applied to the first gate conductor layer, the second gate conductor layer, the first impurity region, and the second impurity region are controlled to retain a group of positive holes, generated by an impact ionization phenomenon or a gate-induced drain leakage current, inside the semiconductor body, in a write operation, a voltage of the semiconductor body is made equal to a first data retention voltage that is higher than the voltage of one of the first impurity region or the second impurity region or the voltages of both of the first impurity region and the second impurity region by at least a built-in voltage, and in an erase operation, the voltage of the semiconductor body is controlled so as to be higher than the first data retention voltage with first capacitive coupling between the first gate conductor layer and the semiconductor body and second capacitive coupling between the second gate conductor layer and the semiconductor body, and a group of remaining positive holes among the group of positive holes are discharged from inside the semiconductor body through one or both of the first impurity region and the second impurity region until the voltage of the semiconductor body becomes equal to a voltage higher than the voltage of one of the first impurity region or the second impurity region or the voltages of both of the first impurity region and the second impurity region by a voltage close to the built-in voltage, and the voltage of the semiconductor body is made equal to a second data retention voltage lower than the first data retention voltage with the first capacitive coupling and the second capacitive coupling (first invention).

In the first invention described above, in the erase operation, the voltage of the first gate conductor layer is increased from a first voltage to a second voltage higher than the first voltage, and the voltage of the second gate conductor layer is increased from a third voltage to a fourth voltage higher than the third voltage, in a first period, the voltage of the semiconductor body is controlled so as to be higher than the first data retention voltage with the first capacitive coupling and the second capacitive coupling, in a second period after the first period, the group of remaining positive holes among the group of positive holes are discharged from inside the semiconductor body through one or both of the first impurity region and the second impurity region until the voltage of the semiconductor body becomes equal to a voltage higher than the voltage of one of the first impurity region or the second impurity region or the voltages of both of the first impurity region and the second impurity region by the built-in voltage, and in a third period after the second period, the voltage of the semiconductor body is made equal to the second data retention voltage lower than the first data retention voltage with the first capacitive coupling and the second capacitive coupling (second invention).

In the second invention described above, with application of the voltages to the first impurity region and the second impurity region and with one or both of the first capacitive coupling and the second capacitive coupling, an inversion layer is not formed in the semiconductor body in the first period, a part of the second period, and the third period in which the voltage of the semiconductor body is changed (third invention).

In the first invention described above, a first gate capacitance between the first gate conductor layer and the semiconductor body is made larger than a second gate capacitance between the second gate conductor layer and the semiconductor body (fourth invention).

A semiconductor element memory device according to the present invention includes a block in which a plurality of columnar semiconductor memory cells each of which is the semiconductor element memory device according to any of the first to fourth inventions described above are arranged in a matrix, in which in the erase operation, the erase operation is performed for all of the semiconductor bodies in the block simultaneously (fifth invention).

A semiconductor element memory device according to the present invention includes a group of blocks that are a plurality of disposed columnar semiconductor memory devices each of which is the semiconductor element memory device according to the fifth invention described above, in which the first impurity region is connected to a source line, the second impurity region is connected to a bit line, one of the first gate conductor layer or the second gate conductor layer is connected to a word line, and the other of the first gate conductor layer or the second gate conductor layer is connected to a first driving control line, the source line is connected to the semiconductor bodies in each of the blocks, and voltages are applied to the source line, the bit line, the first driving control line, and the word line to perform the erase operation of discharging the group of remaining positive holes in all of the semiconductor bodies in a block selected from among the group of blocks (sixth invention).

In any of the fifth and sixth inventions described above, the semiconductor element memory device includes: a logical-physical address conversion table in which a physical address and a logical address of the block or each of the blocks are associated with each other; and a controller circuit that manages the logical-physical address conversion table, in which one or both of the logical-physical address conversion table and the controller circuit are provided outside the semiconductor element memory device (seventh invention).

In the first invention described above, one or both of the first gate conductor layer and the second gate conductor layer is divided into two or more isolated gate conductor layers in plan view or in the vertical direction, and the isolated gate conductor layers are operated synchronously or asynchronously (eighth invention).

In the eighth invention described above, in the vertical direction, the isolated gate conductor layers obtained from one of the first gate conductor layer or the second gate conductor layer are disposed on respective sides of the other of the first gate conductor layer or the second gate conductor layer (ninth invention).

BRIEF DESCRIPTION OF THE DRAWINGS

FIG. 1 is a structural diagram of an SGT-including memory device according to a first embodiment;

FIGS. 2A, 2B and 2C are diagrams for explaining an effect attained in a case where the gate capacitance of a first gate conductor layer 5a connected to a plate line PL is made larger than the gate capacitance of a second gate conductor layer 5b to which a word line WL is connected in the SGT-including memory device according to the first embodiment;

FIGS. 4AA, 4AB and 4AC are diagrams for explaining a mechanism of an erase operation of the SGT-including memory device according to the first embodiment;

FIG. 6B is a table for explaining the block erase operation of the SGT-including memory device according to the second embodiment and showing applied voltages for performing block erasing;

FIG. 7A is a circuit block diagram for explaining a block rewrite operation and a block erase operation of the SGT-including memory device according to a third embodiment;

FIG. 7B is a circuit block diagram for explaining the block rewrite operation and the block erase operation of the SGT-including memory device according to the third embodiment;

DESCRIPTION OF THE PREFERRED EMBODIMENTS

Figure 3A:
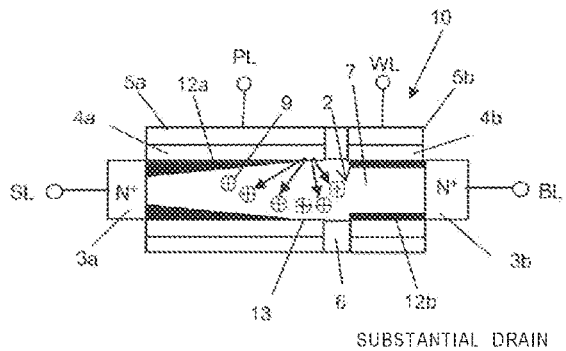
FIGS. 3A, 3B, 3C and 3D are diagrams for explaining a mechanism of a write operation of the SGT-including memory device according to the first embodiment.

Hereinafter, a semiconductor-element-including memory device (hereinafter called a dynamic flash memory) according to embodiments of the present invention will be described with reference to the drawings.

First Embodiment

The structure and operation mechanisms of a dynamic flash memory cell according to a first embodiment of the present invention will be described with reference to FIG. 1 to FIGS. 5A, 5B and 5C. The structure of the dynamic flash memory cell will be described with reference to FIG. 1. An effect attained in a case where the gate capacitance of a first gate conductor layer 5a connected to a plate line PL is made larger than the gate capacitance of a second gate conductor layer 5b to which a word line WL is connected will be described with reference to FIGS. 2A, 2B and 2C. A mechanism of a data write operation will be described with reference to FIGS. 3A, 3B, 3C and 3D, a mechanism of a data erase operation will be described with reference to FIGS. 4AA, 4AB and 4AC to FIGS. 4BD and 4BE, and a mechanism of a data read operation will be described with reference to FIGS. 5A, 5B and 5C.

FIG. 1 illustrates the structure of the dynamic flash memory cell according to the first embodiment of the present invention. On the top and the bottom of a silicon semiconductor column 2 (the silicon semiconductor column is hereinafter referred to as "Si column") (which is an example of "semiconductor body" in the claims) of the P or i (intrinsic) conductivity type formed on a substrate 1 (which is an example of "substrate" in the claims), N$^+$ layers 3a and 3b (hereinafter, a semiconductor region that contains a donor impurity in high concentrations is referred to as "N$^+$ layer") (which are examples of "first impurity region" and "second impurity region" in the claims), one of which functions as the source and the other functions as the drain, are formed respectively. The part of the Si column 2 between the N$^+$ layers 3a and 3b that function as the source and the drain functions as a semiconductor body 7 (which is an example of "semiconductor body" in the claims). Around the semiconductor body 7, a first gate insulator layer 4a (which is an example of "gate insulator layer" in the claims) and a second gate insulator layer 4b (which is an example of "gate insulator layer" in the claims) are formed. The first gate insulator layer 4a and the second gate insulator layer 4b are in contact with or in close vicinity to the N$^+$ layers 3a and 3b that function as the source and the drain respectively. Around the first gate insulator layer 4a and the second gate insulator layer 4b, the first gate conductor layer 5a (which is an example of "first gate conductor layer" in the claims) and the second gate conductor layer 5b (which is an example of "second gate conductor layer" in the claims) are formed respectively. The first gate conductor layer 5a and the second gate conductor layer 5b are isolated from each other by an insulating layer 6 (which is also referred to as "first insulating layer"). The semiconductor body 7 between the N$^+$ layers 3a and 3b is constituted by a first channel Si layer 7a (which is also referred to as "first semiconductor body") surrounded by the first gate insulator layer 4a and a second channel Si layer 7b (which is also referred to as "second semiconductor body") surrounded by the second gate insulator layer 4b. Accordingly, the N$^+$ layers 3a and 3b that function as the source and the drain, the semiconductor body 7, the first gate insulator layer 4a, the second gate insulator layer 4b, the first gate conductor layer 5a, and the second gate conductor layer 5b constitute a dynamic flash memory cell 10. The N$^+$ layer 3a that functions as the source is connected to a source line SL (which is an example of "source line" in the claims), the N$^+$ layer 3b that functions as the drain is connected to a bit line BL (which is an example of "bit line" in the claims), the first gate conductor layer 5a is connected to the plate line PL, which is a first driving control line (which is an example of "first driving control line" in the claims), and the second gate conductor layer 5b is connected to the word line WL (which is an example of "word line" in the claims). Desirably, the dynamic flash memory cell has a structure in which the gate capacitance of the first gate conductor layer 5a to which the plate line PL is connected is larger than the gate capacitance of the second gate conductor layer 5b to which the word line WL is connected.

In FIG. 1, to make the gate capacitance of the first gate conductor layer 5a connected to the plate line PL larger than the gate capacitance of the second gate conductor layer 5b to which the word line WL is connected, the gate length of the first gate conductor layer 5a is made longer than the gate length of the second gate conductor layer 5b. Alternatively, instead of making the gate length of the first gate conductor layer 5a longer than the gate length of the second gate conductor layer 5b, the thicknesses of the respective gate insulator layers may be made different such that the thickness of the gate insulating film of the first gate insulator layer 4a is thinner than the thickness of the gate insulating film of the second gate insulator layer 4b. Alternatively, the dielectric constants of the materials of the respective gate insulator layers may be made different such that the dielectric constant of the gate insulating film of the first gate insulator layer 4a is higher than the dielectric constant of the gate insulating film of the second gate insulator layer 4b. The gate capacitance of the first gate conductor layer 5a connected to the plate line PL may be made larger than the gate capacitance of the second gate conductor layer 5b to which the word line WL is connected, by a combination of any of the lengths of the gate conductor layers 5a and 5b and the thicknesses and dielectric constants of the gate insulator layers 4a and 4b.

FIGS. 2A, 2B and 2C are diagrams for explaining an effect attained in a case where the gate capacitance of the first gate conductor layer 5a connected to the plate line PL is made larger than the gate capacitance of the second gate conductor layer 5b to which the word line WL is connected.

FIG. 2A is a simplified structural diagram of the dynamic flash memory cell according to the first embodiment of the present invention and illustrates only main parts. To the dynamic flash memory cell, the bit line BL, the word line WL, the plate line PL, and the source line SL are connected, and the potential state of the semiconductor body 7 is determined by the voltage states of the lines.

FIG. 2B is a diagram for explaining the capacitance relationships of the respective lines. The capacitance $C_{FB}$ of the semiconductor body 7 is equal to the sum of the capacitance $C_{WL}$ between the gate conductor layer 5b to which the word line WL is connected and the semiconductor body 7, the capacitance $C_{PL}$ between the gate conductor layer 5a to which the plate line PL is connected and the semiconductor body 7, the junction capacitance $C_{SL}$ of the PN junction between the source $N^+$ layer 3a to which the source line SL is connected and the semiconductor body 7, and the junction capacitance $C_{BL}$ of the PN junction between the drain $N^+$ layer 3b to which the bit line BL is connected and the semiconductor body 7, and is expressed as follows.

$$C_{FB}=C_{WL}+C_{PL}+C_{BL}+C_{SL} \quad (1)$$

Therefore, the coupling ratio $\beta_{WL}$ between the word line WL and the semiconductor body 7, the coupling ratio $\beta_{PL}$ between the plate line PL and the semiconductor body 7, the coupling ratio $\beta_{BL}$ between the bit line BL and the semiconductor body 7, and the coupling ratio $\beta_{SL}$ between the source line SL and the semiconductor body 7 are expressed as follows.

$$\beta_{WL}=C_{WL}/(C_{WL}+C_{PL}+C_{BL}+C_{SL}) \quad (2)$$

$$\beta_{PL}=C_{PL}/(C_{WL}+C_{PL}+C_{BL}+C_{SL}) \quad (3)$$

$$\beta_{BL}=C_{BL}/(C_{WL}+C_{PL}+C_{BL}+C_{SL}) \quad (4)$$

$$\beta_{SL}=C_{SL}/(C_{WL}+C_{PL}+C_{BL}+C_{SL}) \quad (5)$$

Here, $C_{PL}>C_{WL}$ holds, and therefore, this results in $\beta_{PL}>\beta_{WL}$.

FIG. 2C is a diagram for explaining a change in the voltage $V_{FB}$ of the semiconductor body 7 when the voltage $V_{WL}$ of the word line WL rises at the time of a read operation or a write operation and subsequently drops. Here, the potential difference $\Delta V_{FB}$ when the voltage $V_{FB}$ of the semiconductor body 7 transitions from a low-voltage state $V_{FBL}$ to a high-voltage state $V_{FBH}$ in response to the voltage $V_{WL}$ of the word line WL rising from 0 V to a high-voltage state $V_{WLH}$ is expressed as follows.

$$\Delta V_{FB} = V_{FBH} - V_{FBL} \quad (6)$$
$$= \beta_{WL} \times V_{WLH}$$

The coupling ratio $\beta_{WL}$ between the word line WL and the semiconductor body 7 is small and the coupling ratio $\beta_{PL}$ between the plate line PL and the semiconductor body 7 is large, and therefore, $\Delta V_{FB}$ is small, and the voltage $V_{FB}$ of the semiconductor body 7 negligibly changes even when the voltage $V_{WL}$ of the word line WL changes at the time of a read operation or a write operation.

Figure 3B:
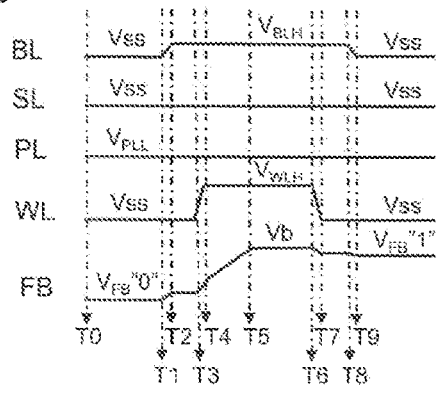

FIGS. 3A, 3B, 3C and 3D illustrate a write operation for the dynamic flash memory cell according to the first embodiment of the present invention. FIG. 3A illustrates a mechanism of the write operation, and FIG. 3B illustrates operation waveforms of the bit line BL, the source line SL, the plate line PL, the word line WL, and the semiconductor body 7 that functions as a floating body FB. At time T0, the dynamic flash memory cell is in a "0" erase state, and the voltage of the semiconductor body 7 is equal to $V_{FB}$ "0". Vss is applied to the bit line BL, the source line SL, and the word line WL, and $V_{PLL}$ is applied to the plate line PL. Here, for example, Vss is equal to 0 V and $V_{PLL}$ is equal to 2 V. Subsequently, from time T1 to time T2, when the bit line BL rises from Vss to $V_{BLH}$, in a case where, for example, Vss is equal to 0 V, the voltage of the semiconductor body 7 becomes equal to $V_{FB}$"0"+$\beta_{BL} \times V_{BLH}$ due to capacitive coupling between the bit line BL and the semiconductor body 7.

The description of the write operation for the dynamic flash memory cell will be continued with reference to FIGS. 3A and 3B. From time T3 to time T4, the word line WL rises from Vss to $V_{WLH}$. Accordingly, when the threshold voltage for a "0" erase state of a second N-channel MOS transistor region that is a region in which the second gate conductor layer 5b to which the word line WL is connected surrounds the semiconductor body 7 is denoted by $Vt_{WL}$ "0", as the voltage of the word line WL rises, in a range from Vss to $Vt_{WL}$ "0", the voltage of the semiconductor body 7 becomes equal to $V_{FB}$"0"+$\beta_{BL} \times V_{BLH}$+$\beta_{WL} \times Vt_{WL}$"0" due to second capacitive coupling (which is an example of "second capacitive coupling" in the claims) between the word line WL and the semiconductor body 7. When the voltage of the word line WL rises to $Vt_{WL}$ "0" or above, an inversion layer 12b in a ring form is formed in the semiconductor body 7 on the inner periphery of the second gate conductor layer 5b and interrupts the second capacitive coupling between the word line WL and the semiconductor body 7.

The description of the write operation for the dynamic flash memory cell will be continued with reference to FIGS. 3A and 3B. From time T3 to time T4, for example, a fixed voltage $V_{PLL}$=2 V is applied to the first gate conductor layer 5a to which the plate line PL is connected, and the second gate conductor layer 5b to which the word line WL is connected is raised to, for example, $V_{WLH}$=4 V. As a result, as illustrated in FIG. 3A, an inversion layer 12a in a ring form is formed in the semiconductor body 7 on the inner periphery of the first gate conductor layer 5a to which the plate line PL is connected, and a pinch-off point 13 is present in the inversion layer 12a. As a result, a first N-channel MOS transistor region including the first gate conductor layer 5a operates in the saturation region. In contrast, the second N-channel MOS transistor region including the second gate conductor layer 5b to which the word line WL is connected operates in the linear region. As a result, a pinch-off point is not present in the semiconductor body 7 on the inner periphery of the second gate conductor layer 5b to which the word line WL is connected, and the inversion layer 12b is formed on the entire inner periphery of the gate conductor layer 5b. The inversion layer 12b that is formed on the entire inner periphery of the second gate conductor layer 5b to which the word line WL is connected substantially functions as the drain of the first N-channel MOS transistor region including the first gate conductor layer 5a. As a result, the electric field becomes maximum in a first boundary region of the semiconductor body 7 between the first N-channel MOS transistor region including the first gate conductor layer 5a and the second N-channel MOS transistor region including the second gate conductor layer 5b that are connected in series, and an impact ionization phenomenon occurs in this region. This region is a source-side region when viewed from the second N-channel MOS transistor region including the second gate conductor layer 5b to which the word line WL is connected, and therefore, this phenomenon is called a source-side impact ionization phenomenon. By this source-side impact ionization phenomenon, electrons flow from the N⁺ layer 3a to which the source line SL is connected toward the N⁺ layer 3b to which the bit line is connected. The accelerated electrons collide with lattice Si atoms, and electron-positive hole pairs are generated by the kinetic energy. Although some of the generated electrons flow into the first gate conductor layer 5a and into the second gate conductor layer 5b, most of the generated electrons flow into the N⁺ layer 3b to which the bit line BL is connected (not illustrated).

Figure 3C:
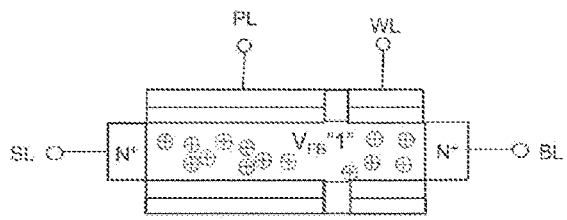

As illustrated in FIG. 3C, a generated group of positive holes 9 (which is an example of "group of positive holes" in the claims) are majority carriers in the semiconductor body 7, with which the semiconductor body 7 is charged to a positive bias. The N⁺ layer 3a to which the source line SL is connected is at 0 V, and therefore, the semiconductor body 7 is charged up to the built-in voltage Vb (about 0.7 V) of the PN junction between the N⁺ layer 3a to which the source line SL is connected and the semiconductor body 7. When the semiconductor body 7 is charged to a positive bias, the threshold voltages of the first N-channel MOS transistor region and the second N-channel MOS transistor region decrease due to a substrate bias effect.

The description of the write operation for the dynamic flash memory cell will be continued with reference to FIG. 3B. From time T6 to time T7, the voltage of the word line WL drops from $V_{WLH}$ to Vss. During this period, although the second capacitive coupling is formed between the word line WL and the semiconductor body 7, the inversion layer 12b interrupts the second capacitive coupling until the voltage of the word line WL drops from $V_{WLH}$ to a threshold voltage $Vt_{WL}$ "1" of the second N-channel MOS transistor region or below when the voltage of the semiconductor body 7 is equal to Vb. Therefore, the capacitive coupling between the word line WL and the semiconductor body 7 is substantially formed only during a period from when the word line WL drops to $Vt_{WL}$ "1" or below to when the word line WL drops to Vss. As a result, the voltage of the semiconductor body 7 becomes equal to $Vb-\beta_{WL} \times Vt_{WL}$ "1". Here, $Vt_{WL}$ "1" is lower than $Vt_{WL}$ "0" described above, and $\beta_{WL} \times Vt_{WL}$ "1" is small.

The description of the write operation for the dynamic flash memory cell will be continued with reference to FIG. 3B. From time T8 to time T9, the bit line BL drops from $V_{BLH}$ to Vss. The bit line BL and the semiconductor body 7 are capacitively coupled with each other, and therefore, the "1" write voltage $V_{FB}$ "1" of the semiconductor body 7 becomes as follows at the end.

$$V_{FB}\text{"1"}=Vb-\beta_{WL} \times Vt_{WL}\text{"1"}-\beta_{BL} \times V_{BLH} \qquad (7)$$

Figure 3D:
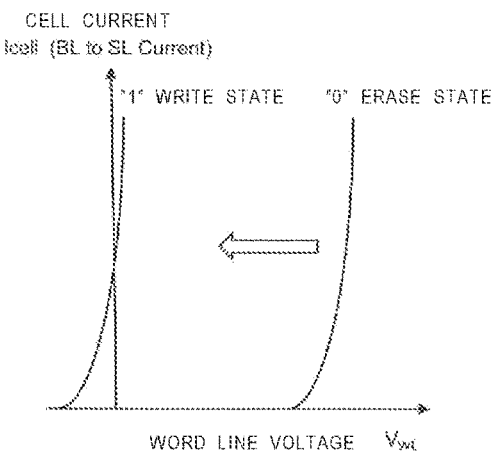

Here, the coupling ratio $\beta_{BL}$ between the bit line BL and the semiconductor body 7 is also small. Accordingly, as illustrated in FIG. 3D, the threshold voltage of the second N-channel MOS transistor region of the second semiconductor body 7b to which the word line WL is connected decreases. The memory write operation (which is an example of "write operation" in the claims) in which the voltage $V_{FB}$"1" in the "1" write state of the semiconductor body 7 is assumed to be a first data retention voltage (which is an example of "first data retention voltage" in the claims) is performed to assign logical storage data "1".

At the time of the write operation, electron-positive hole pairs may be generated by an impact ionization phenomenon in a second boundary region between the first impurity region 3a and the first semiconductor body 7a or in a third boundary region between the second impurity region 3b and the second semiconductor body 7b instead of the first boundary region, and the semiconductor body 7 may be charged with the generated group of positive holes 9.

Figure 4B:
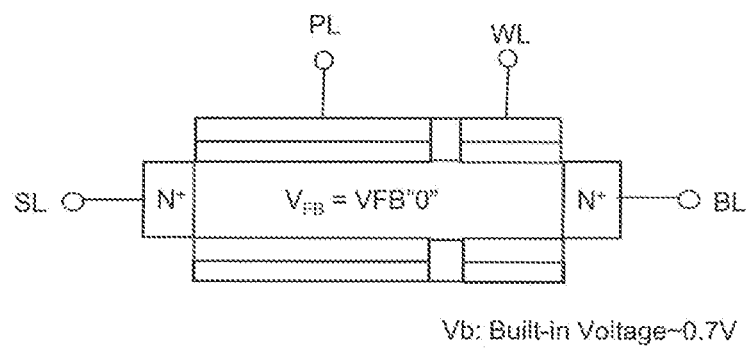
FIGS. 4BD and 4BE are diagrams for explaining the mechanism of the erase operation of the SGT-including memory device according to the first embodiment.
Figure 4B:
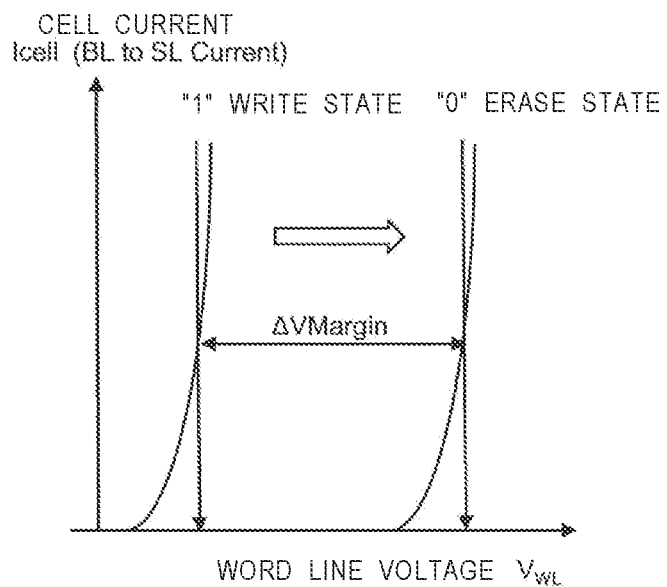

A mechanism of an erase operation will be described with reference to FIGS. 4AA, 4AB and 4AC to FIGS. 4BD and 4BE. The semiconductor body 7 between the N⁺ layers 3a and 3b is electrically isolated from the substrate and functions as a floating body. FIG. 4AA is a timing operation waveform diagram of main nodes in the erase operation. In FIG. 4AA, T0 to T12 indicate times from the start to the end of the erase operation. FIG. 4AB illustrates a state at time T0 before the erase operation, in which the group of positive holes 9 generated by an impact ionization phenomenon in the previous cycle are stored in the semiconductor body 7. From time T1 to time T2, the bit line BL and the source line SL rise from Vss to $V_{BLH}$ and $V_{SLH}$ respectively and are in a high-voltage state. Here, Vss is, for example, equal to 0 V. With this operation, during the subsequent period, namely, a first period (which is an example of "first period" in the claims) from time T3 to time T4, the plate line PL rises from a first voltage (which is an example of "first voltage" in the claims) $V_{PLL}$ to a second voltage (which is an example of "second voltage" in the claims) $V_{PLH}$ and is in a high-voltage state, the word line WL rises from a third voltage (which is an example of "third voltage" in the claims) Vss to a fourth voltage (which is an example of "fourth voltage" in the claims) $V_{WLH}$ and is in a high-voltage state, and this prevents the inversion layer 12a (which is an example of "inversion layer" in the claims) on the inner periphery of the first gate conductor layer 5a to which the plate line PL is connected and the inversion layer 12b on the inner periphery of the second gate conductor layer 5b to which the word line WL is connected from being formed in the semiconductor body 7. Therefore, when the threshold voltage of the second N-channel MOS transistor region on the word line WL side and the threshold voltage of the first N-channel MOS transistor region on the plate line PL side are denoted by $V_{tWL}$ and $V_{tPL}$ respectively, it is desirable that the voltages $V_{BLH}$ and $V_{SLH}$ satisfy $V_{BLH} > V_{WLH} + V_{tWL}$ and $V_{SLH} > V_{PLH} + V_{tPL}$. For example, in a case where $V_{tWL}$ and $V_{tPL}$ are equal to 0.5 V, $V_{WLH}$ and $V_{PLH}$ need to be set to 3 V, and $V_{BLH}$ and $V_{SLH}$ need to be set to 3.5 V or higher.

The description of the mechanism of the erase operation illustrated in FIG. 4AA will be continued. As the plate line PL and the word line WL respectively rise to the second voltage $V_{PLH}$ and the fourth voltage $V_{WLH}$ and are in a high-voltage state during the first period from time T3 to time T4, the voltage of the semiconductor body 7 in a floating state is increased due to first capacitive coupling (which is an example of "first capacitive coupling" in the claims) between the plate line PL and the semiconductor body 7 and second capacitive coupling between the word line WL and the semiconductor body 7. The voltage of the semiconductor body 7 rises from $V_{FB}$ "1" in the "1" write state to a high voltage. This voltage rise is possible because the voltage of the bit line BL and that of the source line SL are high voltages of $V_{BLH}$ and $V_{SLH}$ respectively and the PN junction between the source N⁺ layer 3a and the semiconductor body 7 and the PN junction between the drain N+ layer 3b and the semiconductor body 7 are in a reverse bias state accordingly.

The description of the mechanism of the erase operation illustrated in FIG. 4AA will be continued. During the subsequent period, namely, a second period (which is an example of "second period" in the claims) from time T5 to time T6, the voltage of the bit line BL and that of the source line SL respectively drop from high voltages of $V_{BLH}$ and $V_{SLH}$ to Vss. As a result, the PN junction between the source N+ layer 3a and the semiconductor body 7 and the PN junction between the drain N+ layer 3b and the semiconductor body 7 are in a forward bias state as illustrated in FIG. 4AC, and a group of remaining positive holes (which is an example of "group of remaining positive holes" in the claims) among the group of positive holes 9 in the semiconductor body 7 are discharged to the source N+ layer 3a and to the drain N+ layer 3b. As a result, the voltage $V_{FB}$ of the semiconductor body 7 becomes equal to the built-in voltage Vb of the PN junction formed by the source N+ layer 3a and the P-layer semiconductor body 7 and the PN junction formed by the drain N+ layer 3b and the P-layer semiconductor body 7.

The description of the mechanism of the erase operation illustrated in FIG. 4AA will be continued. Subsequently, from time T7 to time T8, the voltage of the bit line BL and that of the source line SL rise from Vss to high voltages of $V_{BLH}$ and $V_{SLH}$ respectively. With this operation, as illustrated in FIG. 4BD, when the plate line PL drops from the second voltage $V_{PLH}$ to the first voltage $V_{PLL}$ and the word line WL drops from the fourth voltage $V_{WLH}$ to the third voltage Vss during a third period (which is an example of "third period" in the claims) from time T9 to time T10, the voltage $V_{FB}$ of the semiconductor body 7 efficiently changes from Vb to $V_{FB}$ "0" due to the first capacitive coupling between the plate line PL and the semiconductor body 7 and the second capacitive coupling between the word line WL and the semiconductor body 7 without the inversion layer 12a on the plate line PL side or the inversion layer 12b on the word line WL side being formed in the semiconductor body 7. The voltage difference $\Delta V_{FB}$ of the semiconductor body 7 between the "1" write state and the "0" erase state is expressed by the following expressions.

$$V_{FB}"1" = Vb - \beta_{WL} \times Vt_{WL}"1" - \beta_{BL} \times V_{BLH} \tag{7}$$

$$V_{FB}"0" = Vb - \beta_{WL} \times V_{WLH} - \beta_{PL} \times (V_{PLH} - V_{PLL}) \tag{8}$$

$$\begin{aligned}\Delta V_{FB} &= V_{FB}"1" - V_{FB}"0" \\ &= \beta_{WL} \times V_{WLH} + \beta_{PL} \times (V_{PLH} - V_{PLL}) \\ &= \beta_{WL} \times Vt_{WL}"1" - \beta_{BL} \times V_{BLH}\end{aligned} \tag{9}$$

Here, the sum of $\beta_{WL}$ and $\beta_{PL}$ is greater than or equal to 0.8, $\Delta V_{FB}$ is large, and a sufficient margin is provided. As a result, as illustrated in FIG. 4BE, a large margin is provided between the "1" write state and the "0" erase state.

The description of the mechanism of the erase operation illustrated in FIG. 4AA will be continued. During the subsequent period from time T11 to time T12, the voltage of the bit line BL drops from $V_{BLH}$ to Vss and that of the source line SL drops from $V_{SLH}$ to Vss, and the erase operation ends. At this time, although the bit line BL and the source line SL slightly decrease the voltage of the semiconductor body 7 due to capacitive coupling, this decrease is equal to the increase in the voltage of the semiconductor body 7 by the bit line BL and the source line SL from time T7 to time T8 due to capacitive coupling, and therefore, the decrease and the increase in the voltage by the bit line BL and the source line SL are canceled out, and the voltage of the semiconductor body 7 is not affected consequently. The memory erase operation (which is an example of "erase operation" in the claims) in which the voltage $V_{FB}$ "0" in the "0" erase state of the semiconductor body 7 is assumed to be a second data retention voltage (which is an example of "second data retention voltage" in the claims) is performed to assign logical storage data "0". When the voltage applied to the first gate conductor layer 5a connected to the plate line PL is set to a voltage higher than the threshold voltage at the time of logical storage data "1" and lower than the threshold voltage at the time of logical storage data "0" in data reading after the erase operation, a property that a current does not flow even when the voltage of the word line WL is increased can be attained.

Figure 5A:
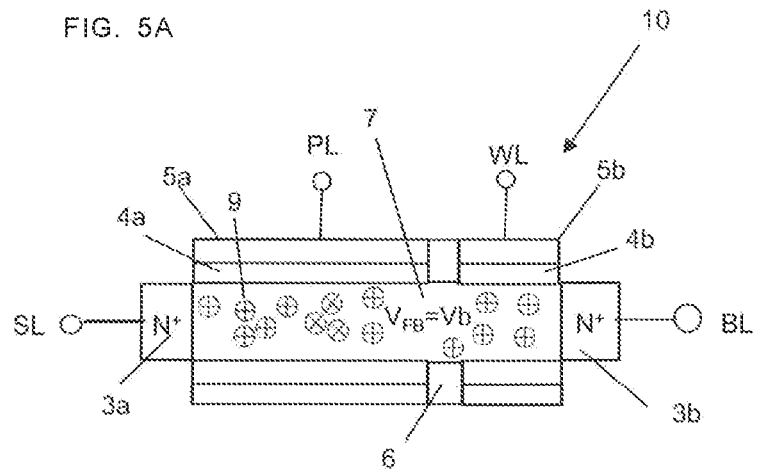
FIGS. 5A, 5B and 5C are diagrams for explaining a mechanism of a read operation of the SGT-including memory device according to the first embodiment.
Figure 5B:
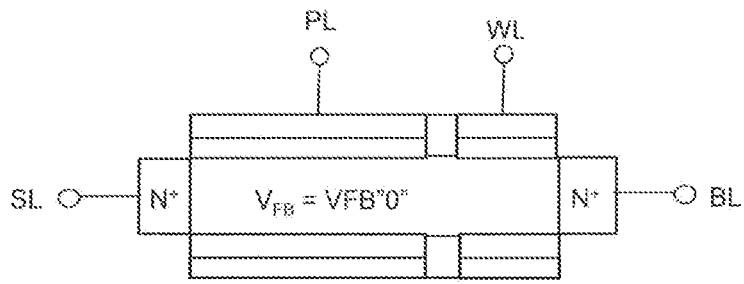
Figure 5C:
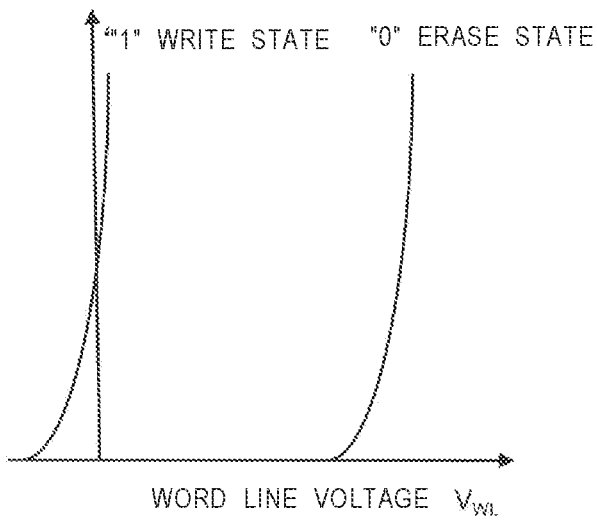

FIGS. 5A, 5B and 5C are diagrams for explaining a read operation for the dynamic flash memory cell according to the first embodiment of the present invention. As illustrated in FIG. 5A, when the semiconductor body 7 is charged up to the built-in voltage Vb (about 0.7 V), the threshold voltage of the second N-channel MOS transistor region including the second gate conductor layer 5b to which the word line WL is connected decreases due to a substrate bias effect. This state is assigned to logical storage data "1". As illustrated in FIG. 5B, a memory block selected before writing is in an erase state "0" in advance, and the voltage $V_{FB}$ of the semiconductor body 7 is equal to $V_{FB}$"0". With a write operation, a write state "1" is stored at random. As a result, logical storage data of logical "0" and that of logical "1" are created for the word line WL. As illustrated in FIG. 5C, the level difference between the two threshold voltages of the word line WL is used to perform reading by a sense amplifier. When the voltage applied to the first gate conductor layer 5a connected to the plate line PL is set to a voltage higher than the threshold voltage at the time of logical storage data "1" and lower than the threshold voltage at the time of logical storage data "0" in data reading, a property that a current does not flow even when the voltage of the word line WL is increased can be attained.

Note that in FIG. 1, it is desirable to make the length of the first gate conductor layer 5a, in the vertical direction, to which the plate line PL is connected further longer than the length of the second gate conductor layer 5b, in the vertical direction, to which the word line WL is connected to attain $C_{PL}>C_{WL}$. However, when only the plate line PL is added, the coupling ratio ($C_{WL}/(C_{PL}+C_{WL}+C_{BL}+C_{SL})$), of capacitive coupling, of the word line WL to the semiconductor body 7 decreases. As a result, the potential change $\Delta V_{FB}$ of the semiconductor body 7 that is a floating body decreases.

As the voltage $V_{PLL}$ of the plate line PL, a fixed voltage of, for example, 2 V may be applied in operation modes other than a mode in which selective erasing is performed in a block erase operation.

Regardless of whether the cross-sectional shape of the Si column 2 illustrated in FIG. 1 is a round shape, an elliptic shape, or a rectangular shape, the operations of the dynamic flash memory described in this embodiment can be performed. Further, a dynamic flash memory cell having a round shape, a dynamic flash memory cell having an elliptic shape, and a dynamic flash memory cell having a rectangular shape may coexist on the same chip.

With reference to FIG. 1, the dynamic flash memory element including, for example, an SGT in which the first gate insulator layer 4a and the second gate insulator layer 4b that surround the entire side surface of the Si column 2 standing on the substrate 1 in the vertical direction are provided and which includes the first gate conductor layer 5a and the second gate conductor layer 5b that entirely surround the first gate insulator layer 4a and the second gate insulator layer 4b has been described. As described in this embodiment, the dynamic flash memory element needs to have a structure that satisfies the condition that the group of positive holes 9 generated by an impact ionization phenomenon are retained in the semiconductor body 7. For this, the semiconductor body 7 needs to have a floating body structure isolated from the substrate 1. Accordingly, even when the semiconductor body is formed horizontally along the substrate 1 by using, for example, GAA (Gate All Around, see, for example, J. Y. Song, W. Y. Choi, J. H. Park, J. D. Lee, and B-G. Park: "Design Optimization of Gate-All-Around (GAA) MOSFETs", IEEE Trans. Electron Devices, vol. 5, no. 3, pp. 186-191, May 2006) technology, which is one type of SGT, or nanosheet technology (see, for example, N. Loubet, et al.: "Stacked Nanosheet Gate-All-Around Transistor to Enable Scaling Beyond FinFET", 2017 IEEE Symposium on VLSI Technology Digest of Technical Papers, T17-5, T230-T231, June 2017), the above-described operations of the dynamic flash memory can be performed. Alternatively, the dynamic flash memory element may have a device structure using SOI (Silicon On Insulator) (see, for example, J. Wan, L. Rojer, A. Zaslavsky, and S. Critoloveanu: "A Compact Capacitor-Less High-Speed DRAM Using Field Effect-Controlled Charge Regeneration", Electron Device Letters, Vol. 35, No. 2, pp. 179-181 (2012), T. Ohsawa, K. Fujita, T. Higashi, Y. Iwata, T. Kajiyama, Y. Asao, and K. Sunouchi: "Memory design using a one-transistor gain cell on SOI", IEEE JSSC, vol. 37, No. 11, pp. 1510-1522 (2002), T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32 nm Node and Beyond", IEEE IEDM (2006), and E. Yoshida and T. Tanaka: "A Design of a Capacitorless 1T-DRAM Cell Using Gate-Induced Drain-Leakage (GIDL) Current for Low-Power and High-Speed Embedded Memory", IEEE IEDM (2003)). In this device structure, the bottom portion of the semiconductor body is in contact with an insulating layer of the SOI substrate, and the other portion of the semiconductor body is surrounded by a gate insulator layer and an element isolation insulating layer. With such a structure, the semiconductor body also has a floating body structure. Accordingly, the dynamic flash memory element provided in this embodiment needs to satisfy the condition that the semiconductor body has a floating body structure. Even with a structure in which a Fin transistor (see, for example, H. Jiang, N. Xu, B. Chen, L. Zengl, Y. He, G. Du, X. Liu and X. Zhang: "Experimental investigation of self-heating effect (SHE) in multiple-fin SOI FinFETs", Semicond. Sci. Technol. 29 (2014) 115021 (7pp)) is formed on an SOI substrate, as long as the semiconductor body has a floating body structure, the operations of the dynamic flash memory can be performed.

Note that in the specification and the claims, the meaning of "cover" in a case of "a gate insulator layer, a gate conductor layer, or the like covers a channel or the like" also includes a case of surrounding entirely as in an SGT or GAA, a case of surrounding except a portion as in a Fin transistor, and a case of overlapping a flat object as in a planar transistor.

Although FIGS. 4AA, 4AB and 4AC to FIGS. 4BD and 4BE illustrate example conditions of the erase operation, the voltages applied to the source line SL, the plate line PL, the bit line BL, and the word line WL may be changed as long as a state in which the group of positive holes 9 in the semiconductor body 7 are discharged through one or both of the $N^+$ layer 3a and the $N^+$ layer 3b can be attained.

In FIG. 1, in the vertical direction, in a part of the semiconductor body 7 surrounded by the insulating layer 6 that is the first insulating layer, the potential distribution of the first semiconductor body 7a and that of the second semiconductor body 7b are connected and formed. Accordingly, the first semiconductor body 7a and the second semiconductor body 7b that constitute the semiconductor body 7 are connected in the vertical direction in the region surrounded by the insulating layer 6 that is the first insulating layer.

In FIG. 1, the first gate conductor layer 5a may be divided into two or more gate conductor layers, and the gate conductor layers may each function as a conductive electrode of the plate line and may be operated synchronously or asynchronously at identical driving voltages or different driving voltages. Similarly, the second gate conductor layer 5b may be divided into two or more gate conductor layers, and the gate conductor layers may each function as a conductive electrode of the word line and may be operated synchronously or asynchronously at identical driving voltages or different driving voltages. In this case, the operations of the dynamic flash memory can also be performed. In a case where the first gate conductor layer 5a is divided into two or more gate conductor layers, at least one of the first gate conductor layers obtained as a result of division assumes the roles of the first gate conductor layer 5a described above. In a case where the second gate conductor layer 5b is divided into two or more gate conductor layers, at least one of the second gate conductor layers obtained as a result of division assumes the roles of the second gate conductor layer 5b described above. In the vertical direction, isolated gate conductor layers obtained from one of the first gate conductor layer 5a or the second gate conductor layer 5b may be disposed on the respective sides of the other of the first gate conductor layer 5a or the second gate conductor layer 5b.

Figure 6A:
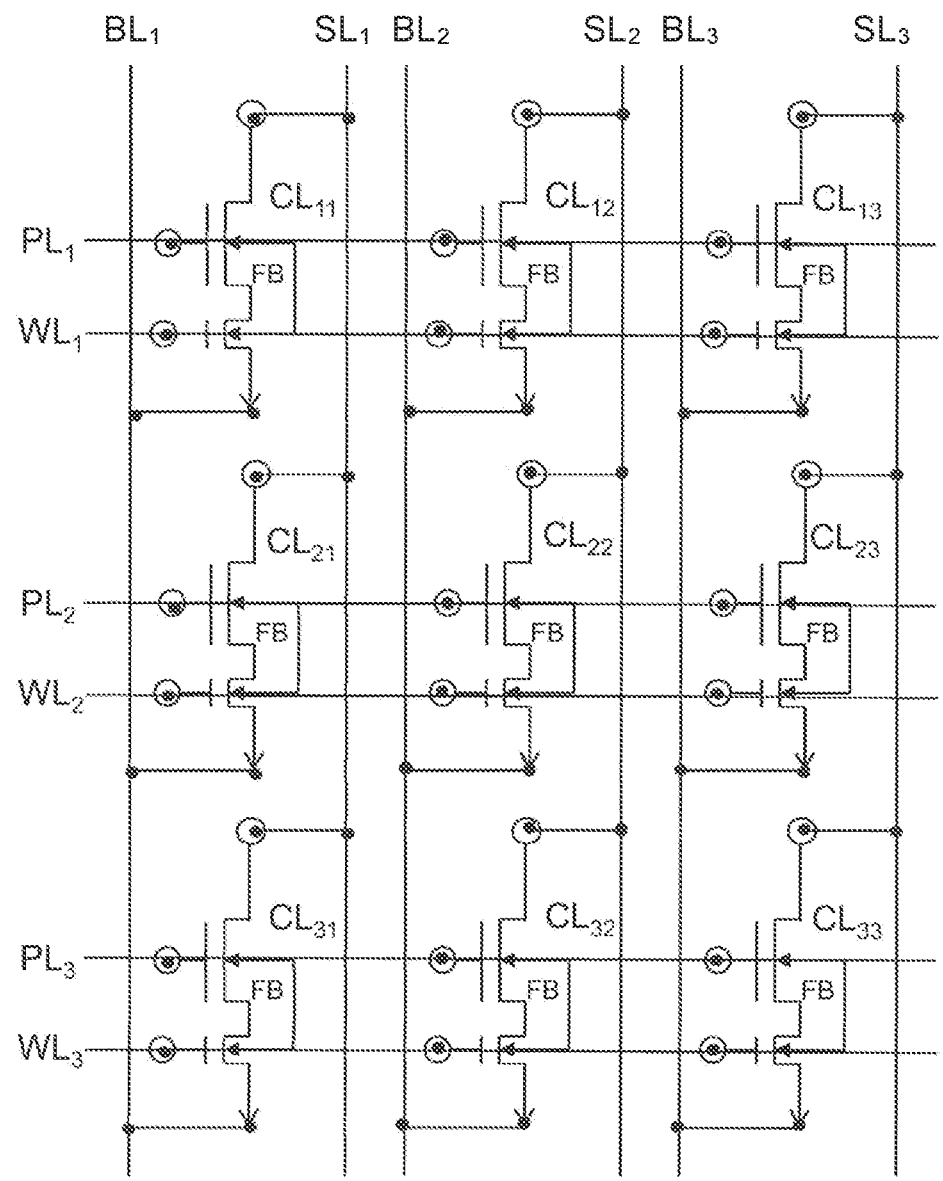
FIG. 6A is a circuit block diagram for explaining a block erase operation of the SGT-including memory device according to a second embodiment.

In FIG. 1, the first gate conductor layer 5a may be connected to the word line WL and the second gate conductor layer 5b may be connected to the plate line PL. In this case, the above-described operations of the dynamic flash memory can also be performed. FIG. 6A illustrates an example where the plate line PL and the word line WL are disposed on the bit line BL side and the source line SL side respectively.

The above-described conditions of voltages applied to the bit line BL, the source line SL, the word line WL, and the plate line PL and the voltage of the floating body are examples for performing basic operations including the erase operation, the write operation, and the read operation, and other voltage conditions may be employed as long as the basic operations of the present invention can be performed.

Further, a junction-less structure in which the conductivities of the $N^+$ layers 3a and 3b and the P-layer semiconductor body 7 of the dynamic flash memory cell illustrated in FIG. 1 are made identical may be employed. The same applies to other embodiments.

This embodiment has the following features.

Feature 1

The dynamic flash memory cell of this embodiment is constituted by the $N^+$ layers 3a and 3b that function as the source and the drain, the semiconductor body 7, the first gate insulator layer 4a, the second gate insulator layer 4b, the first gate conductor layer 5a, and the second gate conductor layer 5b, which are formed in a columnar form as a whole. The $N^+$ layer 3a that functions as the source is connected to the source line SL, the $N^+$ layer 3b that functions as the drain is connected to the bit line BL, the first gate conductor layer 5a is connected to the plate line PL, and the second gate conductor layer 5b is connected to the word line WL. A structure is employed in which the gate capacitance of the first gate conductor layer 5a to which the plate line PL is connected is larger than the gate capacitance of the second gate conductor layer 5b to which the word line WL is connected, which is a feature. In the dynamic flash memory cell, the first gate conductor layer and the second gate conductor layer are stacked in the vertical direction. Accordingly, even when the structure is employed in which the gate capacitance of the first gate conductor layer 5a to which the plate line PL is connected is larger than the gate capacitance of the second gate conductor layer 5b to which the word line WL is connected, the memory cell area does not increase in plan view. Accordingly, a high-performance and highly integrated dynamic flash memory cell can be implemented.

Feature 2

In the erase operation for the dynamic flash memory cell according to the first embodiment of the present invention, both of the first gate conductor layer 5a to which the plate line PL is connected and the second gate conductor layer 5b to which the word line WL is connected transition from a low-voltage state to a high-voltage state, the PN junction between the source $N^+$ layer 3a and the semiconductor body 7 and the PN junction between the drain $N^+$ layer 3b and the semiconductor body 7 are put in a forward bias state with capacitive coupling with the semiconductor body 7, and the group of positive holes 9 in the semiconductor body 7 are discharged to the source $N^+$ layer 3a and the drain $N^+$ layer 3b.

Feature 3

After the operation for the dynamic flash memory cell according to the first embodiment of the present invention described in Feature 2, both of the first gate conductor layer 5a to which the plate line PL is connected and the second gate conductor layer 5b to which the word line WL is connected return from the high-voltage state to the low-voltage state, and the voltage of the semiconductor body 7 is changed to a negative bias with capacitive coupling with the semiconductor body 7 again. As described above, the voltage of the semiconductor body 7 in the "0" erase state can be changed to a negative bias without application of a negative bias to the source $N^+$ layer 3a or the drain $N^+$ layer 3b. Accordingly, a dual well structure or a negative bias generation circuit for applying a negative bias are not necessary, and this facilitates the design and processes of the memory core and peripheral circuits.

Feature 4

In terms of the roles of the first gate conductor layer 5a to which the plate line PL is connected in the dynamic flash memory cell according to the first embodiment of the present invention, in the write operation and in the read operation performed by the dynamic flash memory cell, the voltage of the word line WL changes. At this time, the plate line PL assumes the role of decreasing the capacitive coupling ratio between the word line WL and the semiconductor body 7. As a result, an effect on changes in the voltage of the semiconductor body 7 when the voltage of the word line WL changes can be substantially suppressed. Accordingly, the difference between the threshold voltages of the SGT transistor of the word line WL indicating logical "0" and logical "1" can be increased. This leads to an increased operation margin of the dynamic flash memory cell.

Second Embodiment

A block erase operation of the SGT-including memory device according to a second embodiment will be described with reference to FIG. 6A and FIG. 6B.

FIG. 6A is a circuit diagram illustrating a memory block selected for block erasing. Although nine memory cells $CL_{11}$ to $CL_{33}$ in three rows and three columns are illustrated, the actual memory block is larger than this matrix. To each memory cell, a corresponding one of the source lines $SL_1$ to $SL_3$, a corresponding one of the bit lines $BL_1$ to $BL_3$, a corresponding one of the plate lines $PL_1$ to $PL_3$, and a corresponding one of the word lines $WL_1$ to $WL_3$ are connected. As illustrated in FIG. 6B, to the source lines $SL_1$ to $SL_3$, the bit lines $BL_1$ to $BL_3$, the plate lines $PL_1$ to $PL_3$, and the word lines $WL_1$ to $WL_3$ of the memory block selected for block erasing, the pulse waveforms as illustrated in FIG. 4AA are applied. For a block (recorded-data retaining block) that is not erased, no pulse waveforms are applied.

Feature 1

For the dynamic flash memory cells in the second embodiment, block erasing is performed for each of the blocks individually, and therefore, the bit line BL, the source line SL, the plate line PL, and the word line WL can be controlled for each of the blocks independently.

Feature 2

For the dynamic flash memory cells in the second embodiment, although the block erase operation described with reference to FIG. 6A and FIG. 6B is performed as in a flash memory, rewriting is performed with a low electric field far lower than that in a flash memory. Therefore, in terms of reliability, the limit of the number of rewrites for each block need not be specified.

Third Embodiment

FIGS. 7A, 7B, 7C and 7D are circuit block diagrams for explaining a block rewrite operation and a block erase operation for dynamic flash memory cells according to a third embodiment.

In FIG. 7A, a controller circuit 33 (which is an example of "controller circuit" in the claims) and a logical-physical block address conversion look-up table circuit (logical-physical address conversion table) 32 (which is an example of "logical-physical address conversion table" in the claims) continuously manage a correspondence between data stored at a logical block address and a corresponding physical block address in the dynamic flash memory. This is because in a dynamic flash memory, in block data rewriting, a block that has already been erased is used to perform rewriting as in a flash memory, and therefore, the correspondence between the logical block address and the physical block address needs to be continuously managed. The controller circuit 33 and the logical-physical address conversion table 32 may be provided in the chip of the dynamic flash memory or may be provided outside the chip as illustrated in FIG. 7A. An order from the logical-physical address conversion table 32 is input to a block address decoder circuit 34, and a block for which rewriting is performed and a block that is erased are selected from among blocks BLK00 to BLK33 (which are examples of "block" in the claims).

Figure 7C:
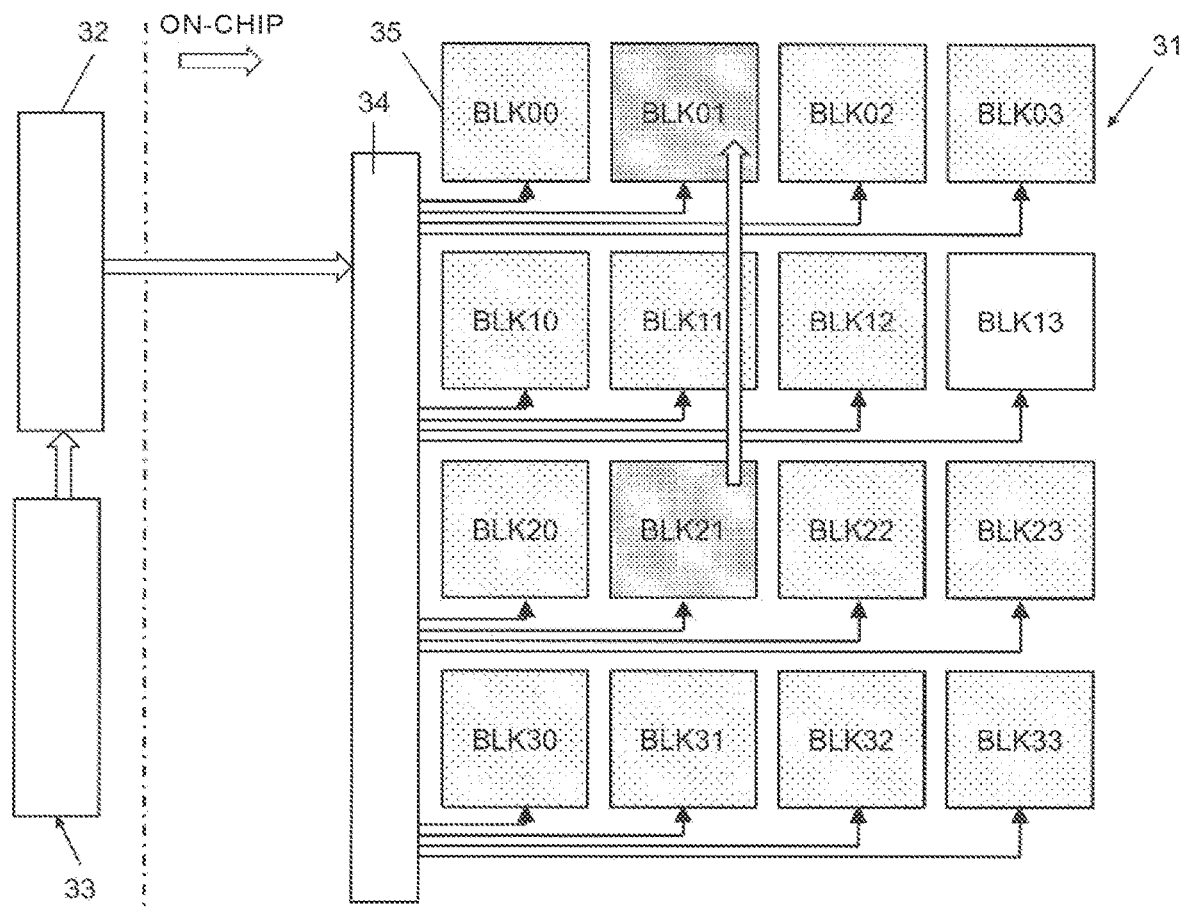
FIG. 7C is a circuit block diagram for explaining the block rewrite operation and the block erase operation of the SGT-including memory device according to the third embodiment.

An erase operation associated with rewriting of storage data will be specifically described with reference to FIGS. 7B, 7C and 7D. In FIG. 7B, among 16 blocks (4×4 blocks), namely, the blocks BLK00 to BLK33, of the dynamic flash memory, the blocks BLK01 and BLK13 are blocks that have already been erased, and the other blocks store data therein. A case where an order for rewriting storage data in, for example, the block BLK21 is issued from the controller circuit 33 is assumed. The controller circuit 33 first refers to the logical-physical address conversion table 32 and searches for a block that has been erased. Next, the controller circuit 33 finds the block BLK01 that is a desired erased block.

Thereafter, as illustrated in FIG. 7C, data that is stored in the block BLK21, for which rewriting is performed, and that is not to be rewritten is copied to the block BLK01 that has been erased, and page data related to the word line WL for rewriting is newly written to the block BLK01.

Figure 7D:
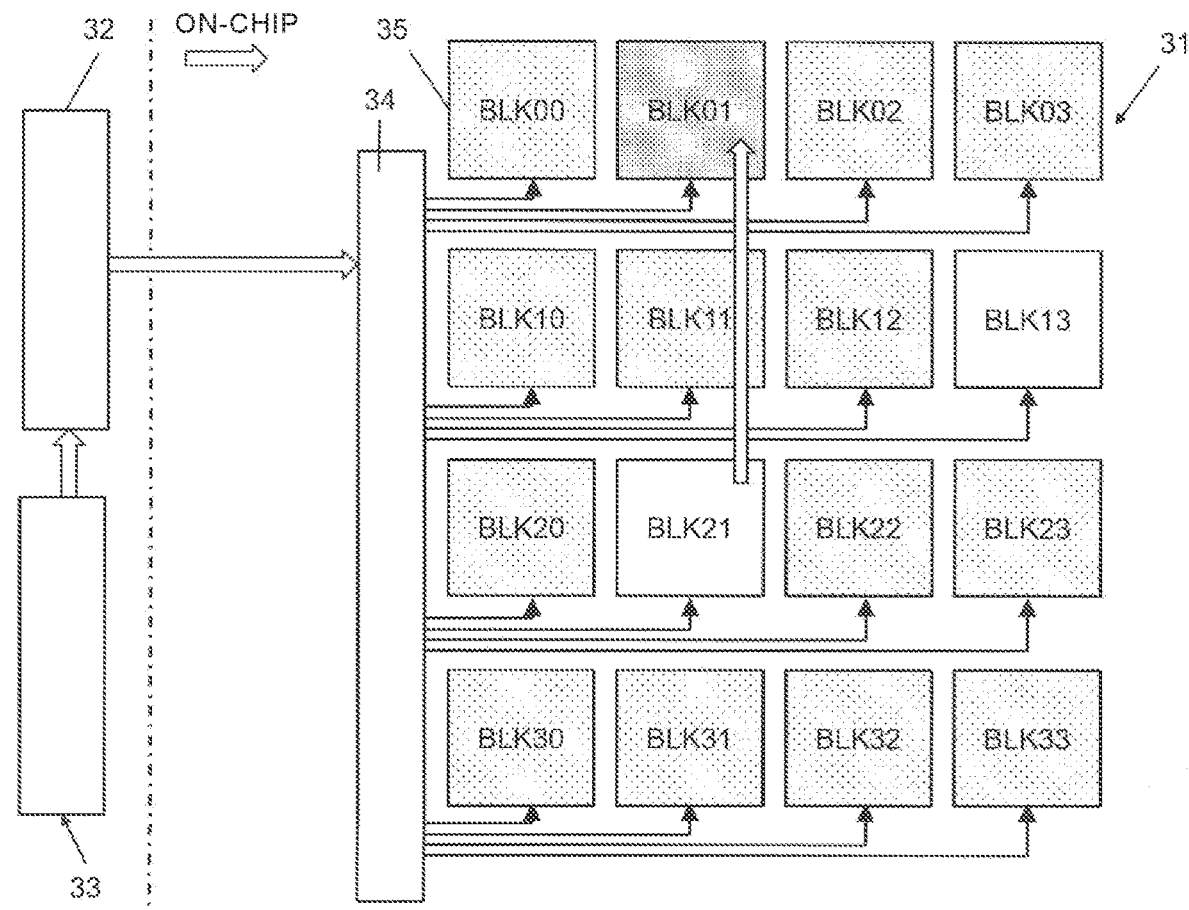
FIG. 7D is a circuit block diagram for explaining the block rewrite operation and the block erase operation of the SGT-including memory device according to the third embodiment.
Figure 8A:
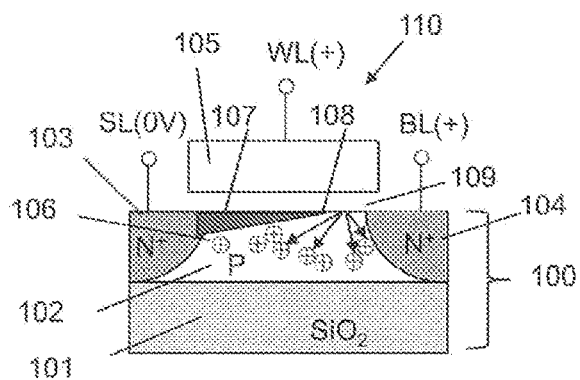
FIGS. 8A, 8B, 8C and 8D are diagrams for explaining a write operation of a DRAM memory cell including no capacitor in the related art.
Figure 8B:
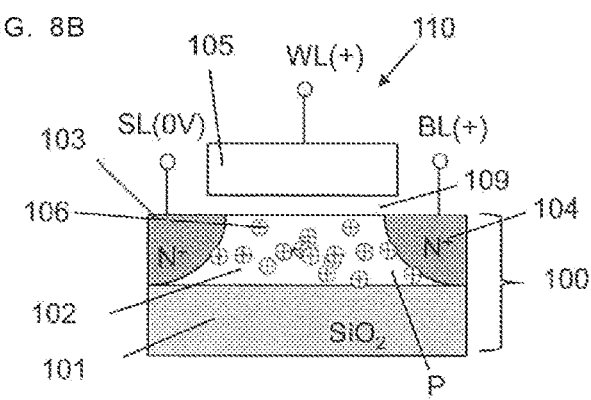
Figure 8C:
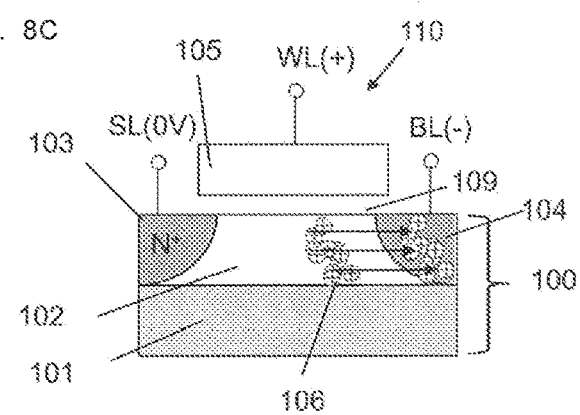
Figure 8D:
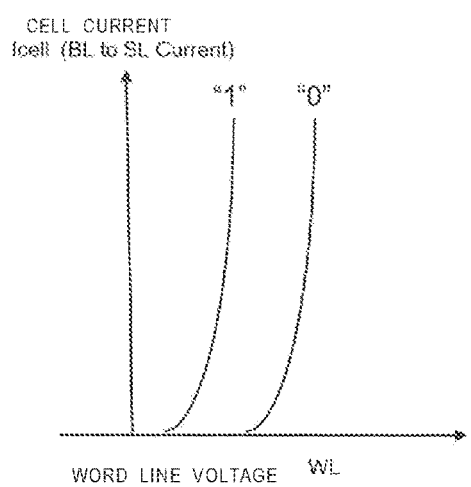
Figure 9A:
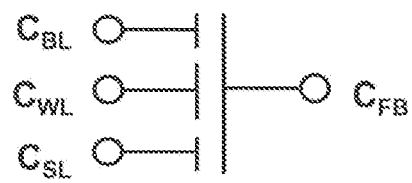
FIGS. 9A and 9B are diagrams for explaining a problem in the operation of the DRAM memory cell including no capacitor in the related art.
Figure 9B:
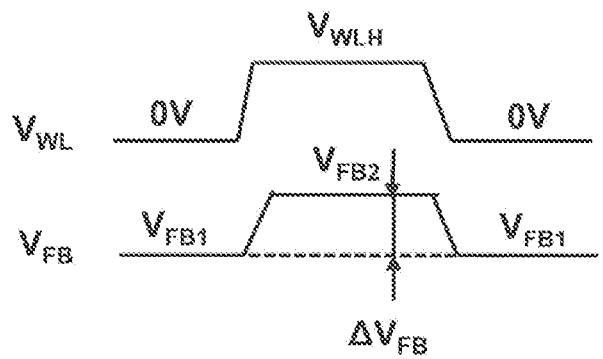
Figure 10A:
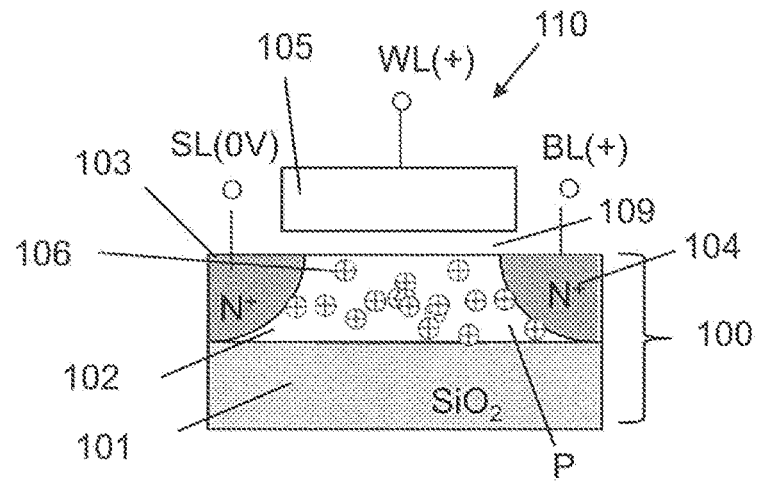
FIGS. 10A, 10B and 10C are diagrams for explaining a read operation of the DRAM memory cell including no capacitor in the related art.
Figure 10B:
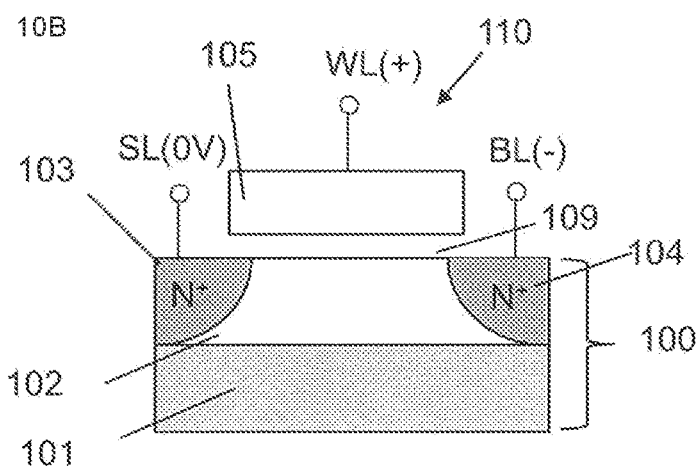
Figure 10C:
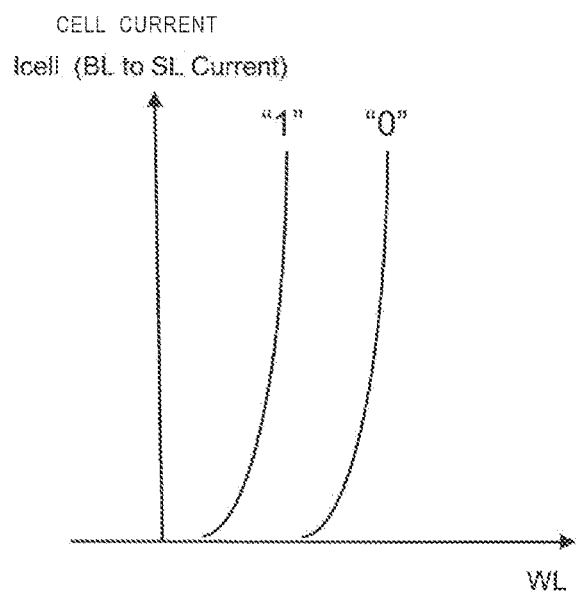

Thereafter, as illustrated in FIG. 7D, when data copy from the block BLK21 to the block BLK01 and writing of new data in the block BLK01 end, block erasing of the old storage data in the block BLK21 is performed. The physical block BLK01 is registered in the logical-physical address conversion table 32 via the controller circuit 33.

In FIGS. 7A, 7B, 7C and 7D, when data copy from the block BLK21 to the block BLK01 after selection of one block BLK21, and writing of new data in the block BLK01 end, block erasing of the old storage data in the block BLK21 is performed. Upon block erasing, at least one or more blocks may be simultaneously selected and block erasing may be performed.

Although operations similar to the block rewriting and block erasing described with reference to FIGS. 7B, 7C and 7D are performed in a flash memory, a controller circuit monitors and manages the number of rewrites on a block-by-block basis in the flash memory. In a flash memory, a high electric field is applied and electrons stored in a storage node is put in and taken out through a tunnel oxide film. Therefore, the limit of the number of rewrites related to the tunnel oxide film is specified in the specifications. However, in the dynamic flash memory cell of this embodiment, rewriting is performed with a low electric field far lower than that in a flash memory. Therefore, in terms of reliability, the limit of the number of rewrites for each block need not be specified.

In the block rewrite and block erase operations described with reference to FIGS. 7B, 7C and 7D, a cache memory (not illustrated) that temporarily stores storage data in a block for which rewriting is performed may be necessary. This cache memory may be provided inside or outside the chip of the dynamic flash memory of this embodiment.

The logical-physical address conversion table 32 or the cache memory may be constituted by a memory cell array that enables high-speed access to dynamic flash memory cells.

To retain storage data in blocks, a refresh operation for each block may be performed. In this case, refreshing is performed in the block at a physical address concerned, and therefore, the block rewrite operation need not be performed or the block erase operation need not be performed.

Feature

Although the dynamic flash memory cells in the third embodiment are volatile memory, the block rewrite operation and the block erase operation that are functions implemented only in a flash memory, which is nonvolatile memory, are implemented, and memory cells that allow higher integration can be provided.

To write "1", electron-positive hole pairs may be generated by an impact ionization phenomenon using a gate-induced drain leakage (GIDL) current described in E. Yoshida and T. Tanaka: "A Design of a Capacitorless 1T-DRAM Cell Using Gate-Induced Drain-Leakage (GIDL) Current for Low-Power and High-Speed Embedded Memory", IEEE IEDM (2003) and E. Yoshida and T. Tanaka: "A Capacitorless 1T-DRAM Technology Using Gate-Induced Drain-Leakage (GIDL) Current for Low-Power and High-Speed Embedded Memory", IEEE Transactions on Electron Devices, Vol. 53, No. 4, pp. 692-69, April 2006, and the floating body FB may be filled with the generated group of positive holes. The same applies to other embodiments according to the present invention.

Even with a structure in which the polarity of the conductivity type of each of the N$^+$ layers 3a and 3b and the P-layer Si column 2 in FIG. 1 is reversed, the operations of the dynamic flash memory can be performed. In this case, in the Si column 2 that is of N-type, the majority carriers are electrons. Therefore, a group of electrons generated by impact ionization are stored in the semiconductor body 7, and a "1" state is set.

OTHER EMBODIMENTS

Although the Si column is formed in the present invention, a semiconductor column made of a semiconductor material other than Si may be formed. The same applies to other embodiments according to the present invention.

Although the logical-physical address conversion table illustrated in FIGS. 7A, 7B, 7C and 7D are provided outside the chip of the columnar semiconductor memory device in the third embodiment, the logical-physical address conversion table may be provided on the chip in the columnar semiconductor memory device. The same applies to other embodiments according to the present invention.

The logical-physical address conversion table illustrated in FIGS. 7A, 7B, 7C and 7D in the third embodiment may be constituted by a dynamic flash memory that enables high-speed access to memory elements. The same applies to other embodiments according to the present invention.

Each of the blocks BLK00 to BLK33 illustrated in FIGS. 7A, 7B, 7C and 7D in the third embodiment may be provided with a timer circuit, and the blocks may be refreshed in accordance with instructions of the respective timer circuits. The same applies to other embodiments according to the present invention.

Among the blocks BLK00 to BLK33 illustrated in FIGS. 7A, 7B, 7C and 7D in the third embodiment, for at least two or more blocks, block erasing may be simultaneously performed. The same applies to other embodiments according to the present invention.

While block erasing is selectively performed for a specific block among the blocks BLK00 to BLK33 illustrated in FIGS. 7A, 7B, 7C and 7D in the third embodiment, writing or reading may be performed simultaneously for another block. The same applies to other embodiments according to the present invention.

In a vertical NAND-type flash memory circuit, memory cells that are stacked in a plurality of tiers in the vertical direction and each of which is constituted by a semiconductor column, which functions as the channel, and a tunnel oxide layer, a charge storage layer, an interlayer insulating layer, and a control conductor layer that surround the semiconductor column are formed. At the semiconductor columns on both ends of these memory cells, a source line impurity region corresponding to the source and a bit line impurity region corresponding to the drain are disposed respectively. In addition, for one memory cell, when one of the memory cells on both sides of the one memory cell functions as the source, the other functions as the drain. Accordingly, the vertical NAND-type flash memory circuit is one type of SGT circuit. Therefore, the present invention is also applicable to a circuit in which a NAND-type flash memory circuit coexists.

To write "1", electron-positive hole pairs may be generated by an impact ionization phenomenon using a GIDL (gate-induced drain leakage) current described with reference to E. Yoshida and T. Tanaka: "A Capacitorless 1T-DRAM Technology Using Gate-Induced Drain-Leakage (GIDL) Current for Low-Power and High-Speed Embedded Memory", IEEE Transactions on Electron Devices, Vol. 53, No. 4, pp. 692-69, April 2006, and the floating body FB may be filled with the generated group of positive holes. The same applies to other embodiments according to the present invention.

Various embodiments and modifications can be made to the present invention without departing from the spirit and scope of the present invention in a broad sense. The above-described embodiments are intended to explain examples of the present invention and are not intended to limit the scope of the present invention. Any of the above-described embodiments and modifications can be combined. Further, the above-described embodiments from which some of the configuration requirements are removed as needed are also within the scope of the technical spirit of the present invention.

With the semiconductor-element-including memory device according to the present invention, a high-density and high-performance dynamic flash memory that is an SGT-including memory device can be obtained.

What is claimed is:

1. A semiconductor element memory device comprising:
   a semiconductor body that stands on a substrate in a vertical direction relative to the substrate or that extends along the substrate in a horizontal direction relative to the substrate;
   a first impurity region and a second impurity region that are disposed at respective ends of the semiconductor body;
   a gate insulator layer that is in contact with a side surface of the semiconductor body between the first impurity region and the second impurity region;
   a first gate conductor layer that partially or entirely covers the gate insulator layer; and
   a second gate conductor layer that is adjacent to the first gate conductor layer and that is in contact with a side surface of the gate insulator layer, wherein
   voltages applied to the first gate conductor layer, the second gate conductor layer, the first impurity region, and the second impurity region are controlled to retain a group of positive holes, generated by an impact ionization phenomenon or a gate-induced drain leakage current, inside the semiconductor body,
   in a write operation, a voltage of the semiconductor body is made equal to a first data retention voltage that is higher than the voltage of one of the first impurity region or the second impurity region or the voltages of both of the first impurity region and the second impurity region by at least a built-in voltage, and
   in an erase operation, the voltage of the semiconductor body is controlled so as to be higher than the first data retention voltage with first capacitive coupling between the first gate conductor layer and the semiconductor body and second capacitive coupling between the second gate conductor layer and the semiconductor body, and a group of remaining positive holes among the group of positive holes are discharged from inside the semiconductor body through one or both of the first impurity region and the second impurity region until the voltage of the semiconductor body becomes equal to a voltage higher than the voltage of one of the first impurity region or the second impurity region or the voltages of both of the first impurity region and the second impurity region by a voltage close to the built-in voltage, and
   the voltage of the semiconductor body is made equal to a second data retention voltage lower than the first data retention voltage with the first capacitive coupling and the second capacitive coupling.

2. The semiconductor element memory device according to claim 1, wherein
   in the erase operation,
   the voltage of the first gate conductor layer is increased from a first voltage to a second voltage higher than the first voltage, and the voltage of the second gate conductor layer is increased from a third voltage to a fourth voltage higher than the third voltage,
   in a first period, the voltage of the semiconductor body is controlled so as to be higher than the first data retention voltage with the first capacitive coupling and the second capacitive coupling,
   in a second period after the first period, the group of remaining positive holes among the group of positive holes are discharged from inside the semiconductor body through one or both of the first impurity region and the second impurity region until the voltage of the semiconductor body becomes equal to a voltage higher than the voltage of one of the first impurity region or the second impurity region or the voltages of both of the first impurity region and the second impurity region by the built-in voltage, and
   in a third period after the second period, the voltage of the semiconductor body is made equal to the second data retention voltage lower than the first data retention voltage with the first capacitive coupling and the second capacitive coupling.

3. The semiconductor element memory device according to claim 2, wherein
   with application of the voltages to the first impurity region and the second impurity region and with one or both of the first capacitive coupling and the second capacitive coupling, an inversion layer is not formed in the semiconductor body in the first period, a part of the second period, and the third period in which the voltage of the semiconductor body is changed.

4. The semiconductor element memory device according to claim 1, wherein
   a first gate capacitance between the first gate conductor layer and the semiconductor body is made larger than a second gate capacitance between the second gate conductor layer and the semiconductor body.

5. A semiconductor element memory device comprising a block in which a plurality of columnar semiconductor memory cells each of which is the semiconductor element memory device according to claim 1 are arranged in a matrix, wherein
   in the erase operation, the erase operation is performed for all of the semiconductor bodies in the block simultaneously.

6. A semiconductor element memory device comprising a group of blocks that are a plurality of disposed columnar semiconductor memory devices each of which is the semiconductor element memory device according to claim 5, wherein the first impurity region is connected to a source line, the second impurity region is connected to a bit line, one of the first gate conductor layer or the second gate conductor layer is connected to a word line, and the other of the first gate conductor layer or the second gate conductor layer is connected to a first driving control line, the source line is connected to the semiconductor bodies in each of the blocks, and voltages are applied to the source line, the bit line, the first driving control line, and the word line to perform the erase operation of discharging the group of remaining positive holes in all of the semiconductor bodies in a block selected from among the group of blocks.

7. The semiconductor element memory device according to claim 5, comprising:

a logical-physical address conversion table in which a physical address and a logical address of the block or each of the blocks are associated with each other; and a controller circuit that manages the logical-physical address conversion table, wherein one or both of the logical-physical address conversion table and the controller circuit are provided outside the columnar semiconductor memory cells.

8. The semiconductor element memory device according to claim 1, wherein one or both of the first gate conductor layer and the second gate conductor layer is divided into two or more isolated gate conductor layers in plan view or in the vertical direction, and the isolated gate conductor layers are operated synchronously or asynchronously.

9. The semiconductor element memory device according to claim 8, wherein in the vertical direction, the isolated gate conductor layers obtained from one of the first gate conductor layer or the second gate conductor layer are disposed on respective sides of the other of the first gate conductor layer or the second gate conductor layer.

* * * * *